United States Patent [19]

Sato

[11] Patent Number: 5,532,634
[45] Date of Patent: Jul. 2, 1996

[54] HIGH-INTEGRATION J-K FLIP-FLOP CIRCUIT

[75] Inventor: Yasushi Sato, Kawasaki, Japan

[73] Assignee: Kabushiki Kaisha Toshiba, Kawasaki, Japan

[21] Appl. No.: 339,240

[22] Filed: Nov. 10, 1994

[30] Foreign Application Priority Data

Nov. 10, 1993 [JP] Japan ................................. 5-281276
Sep. 12, 1994 [JP] Japan ................................. 6-217652

[51] Int. Cl.⁶ ................................................. H03K 3/356
[52] U.S. Cl. ................................. 327/216; 327/203
[58] Field of Search ................................. 327/216, 219,
327/223, 225, 214, 199, 200, 201, 202,
203, 208, 210, 211, 212, 213

[56] References Cited

U.S. PATENT DOCUMENTS

| | | | |
|---|---|---|---|
| 4,350,905 | 9/1982 | Sato . | |
| 4,356,411 | 10/1982 | Suzuki et al. | 327/203 |
| 4,512,029 | 4/1985 | Brice | 327/203 |
| 4,806,786 | 2/1989 | Valentine | 327/203 |
| 5,140,179 | 8/1992 | Takano | 327/203 |
| 5,170,074 | 12/1992 | Aoki | 327/223 |

FOREIGN PATENT DOCUMENTS

| | | | |
|---|---|---|---|
| 4121652 | 9/1979 | Japan | 327/208 |
| 6036222 | 4/1981 | Japan | 327/208 |
| 6036221 | 4/1981 | Japan | 327/208 |
| 0134622 | 7/1985 | Japan | 327/208 |
| 4-245713 | 9/1992 | Japan . | |
| 4-276917 | 10/1992 | Japan | 327/203 |
| 5-191239 | 7/1993 | Japan . | |

Primary Examiner—Timothy P. Callahan
Assistant Examiner—Eunja Shin
Attorney, Agent, or Firm—Oblon, Spivak, McClelland, Maier & Neustadt

[57] ABSTRACT

This invention relates to a J-K flip-flop circuit which achieves a decrease in area required on an integrated circuit and a reduction of cost. Three N-MOSFETs, whose gates respectively receive a clock CL1, a J signal, and a signal from one node of a second flip-flop circuit, are connected in series with each other, and one end of this series connection is connected to one node of a first flip-flop circuit. Three N-MOSFETs, whose gates respectively receive the clock CL1, a K signal, and a signal from the other node of the second flip-flop circuit, are connected in series with each other, and one end of this series connection is connected to the other node of the first flip-flop circuit. Two N-MOSFETs, whose gates respectively receive a clock CL2 and a signal from one node of the first flip-flop circuit, are connected in series with each other, and one end of this series connection is connected to the other node of the second flip-flop circuit. Two N-MOSFETs, whose gates respectively receive the clock signal CL2 and a signal from the other node of the first flip-flop circuit, are connected in series with each other, and one end of this series connection is connected to one node of the second flip-flop circuit. The other end of each of these series connections is connected to a ground voltage.

14 Claims, 27 Drawing Sheets

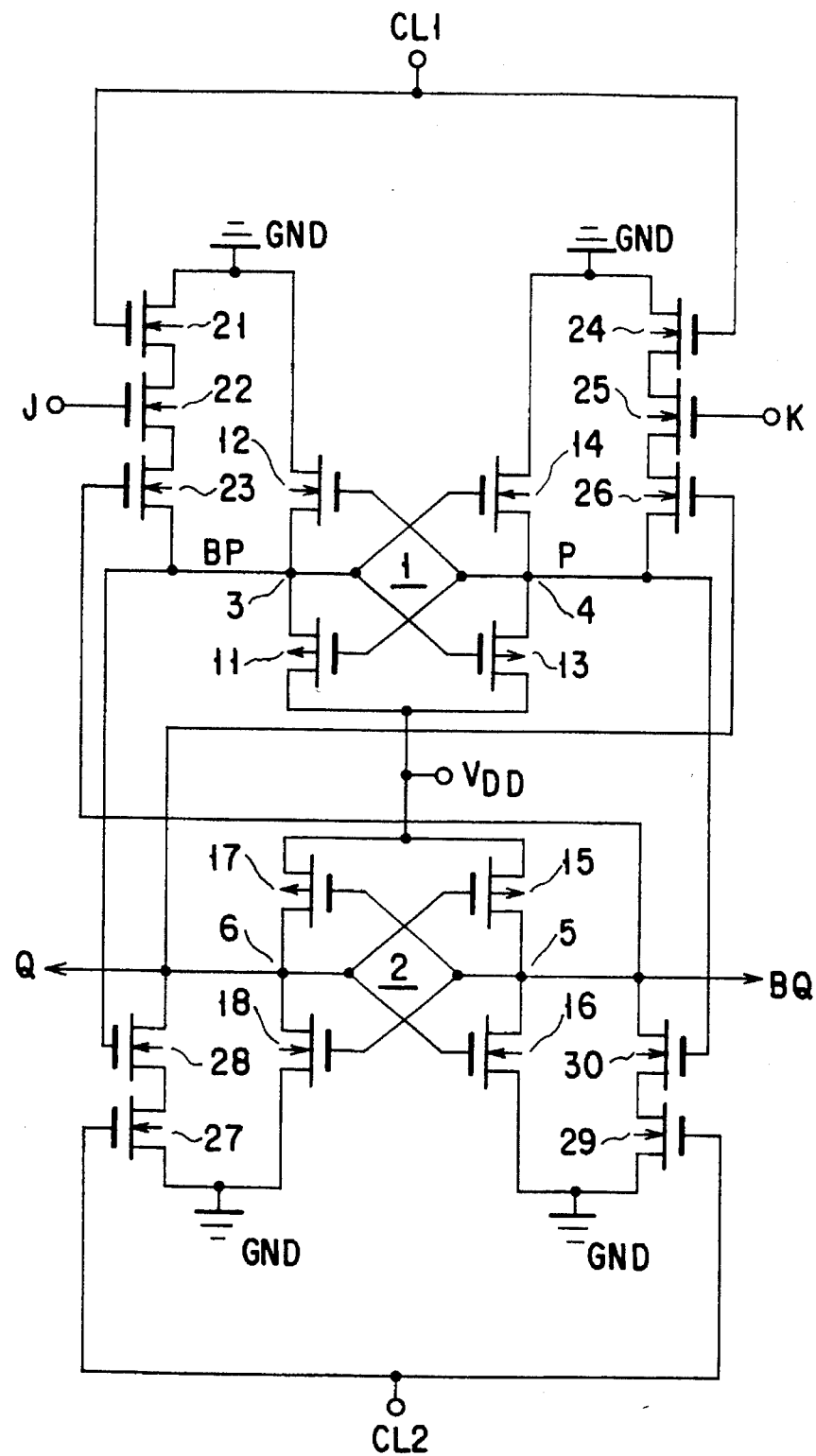
F I G. 3

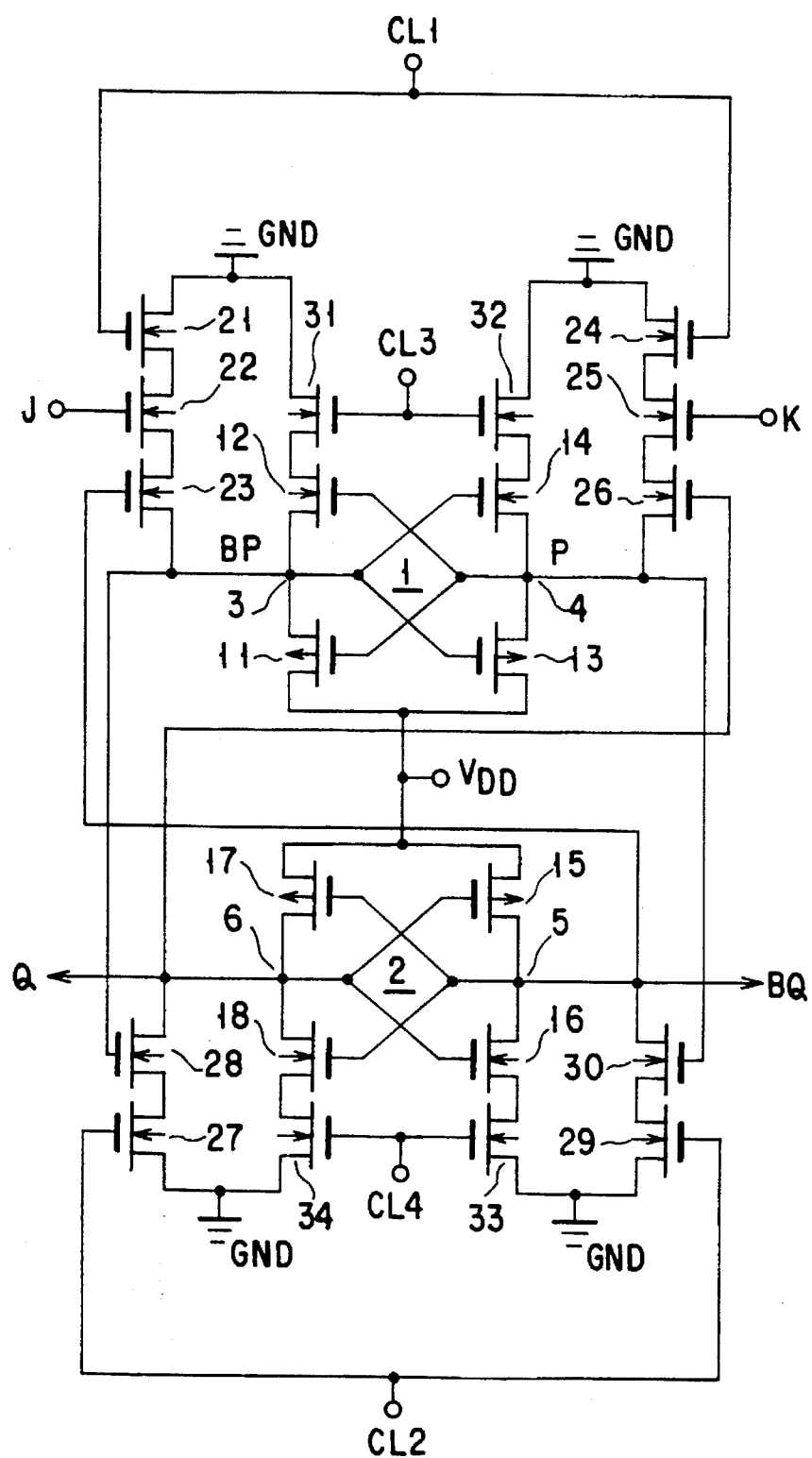
F I G. 4A

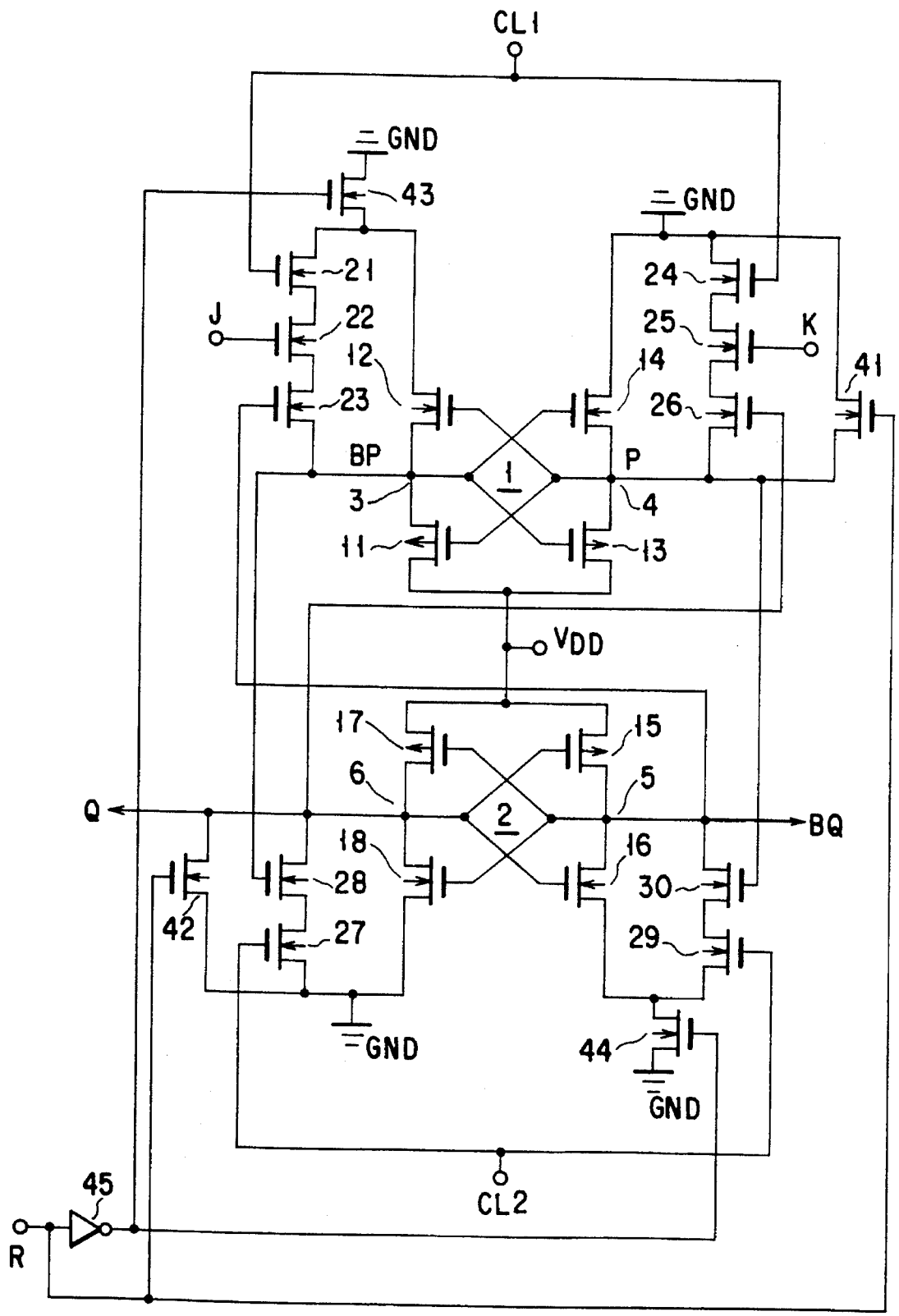
F I G. 6

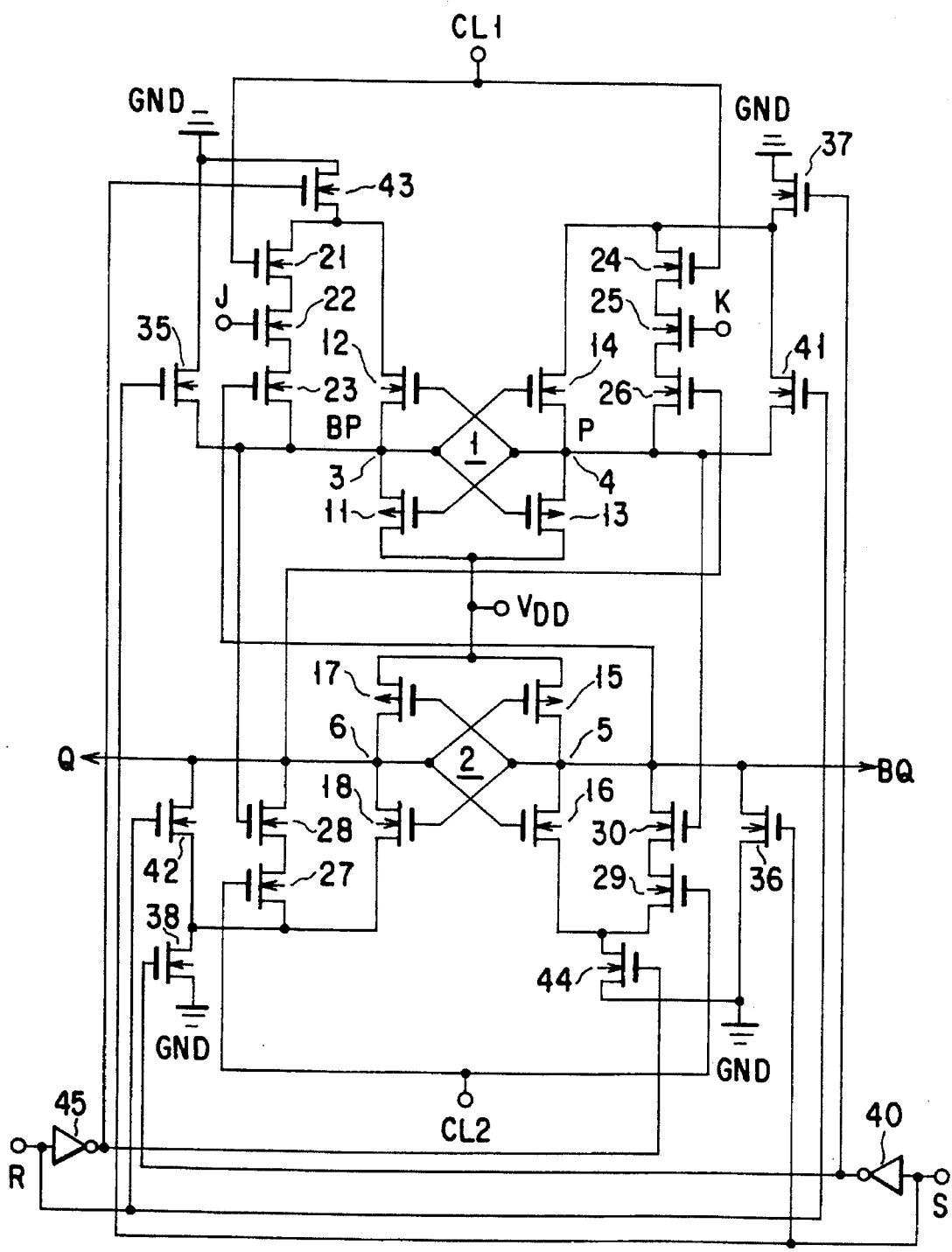
F I G. 7

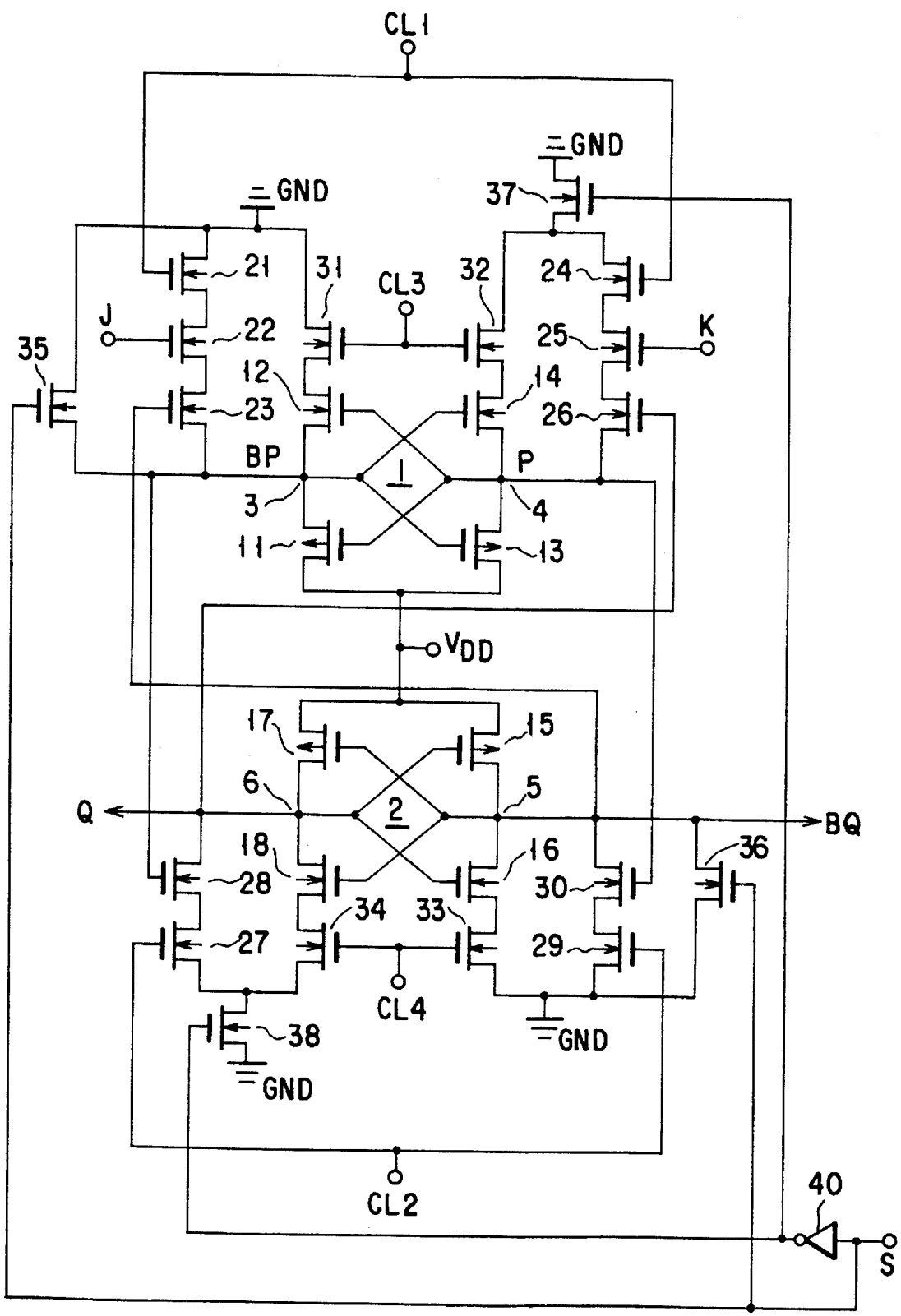
F I G. 9

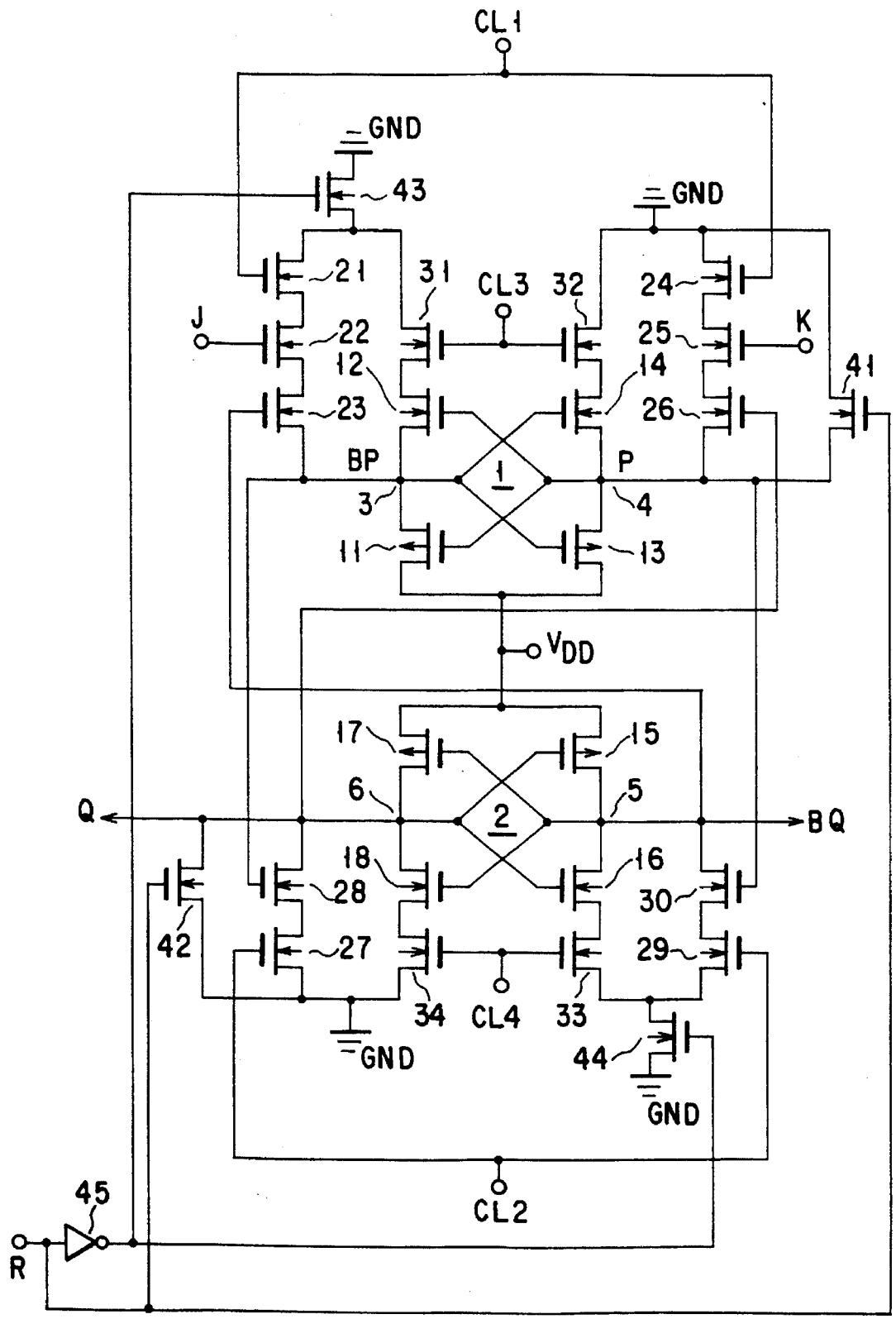
F I G. 10

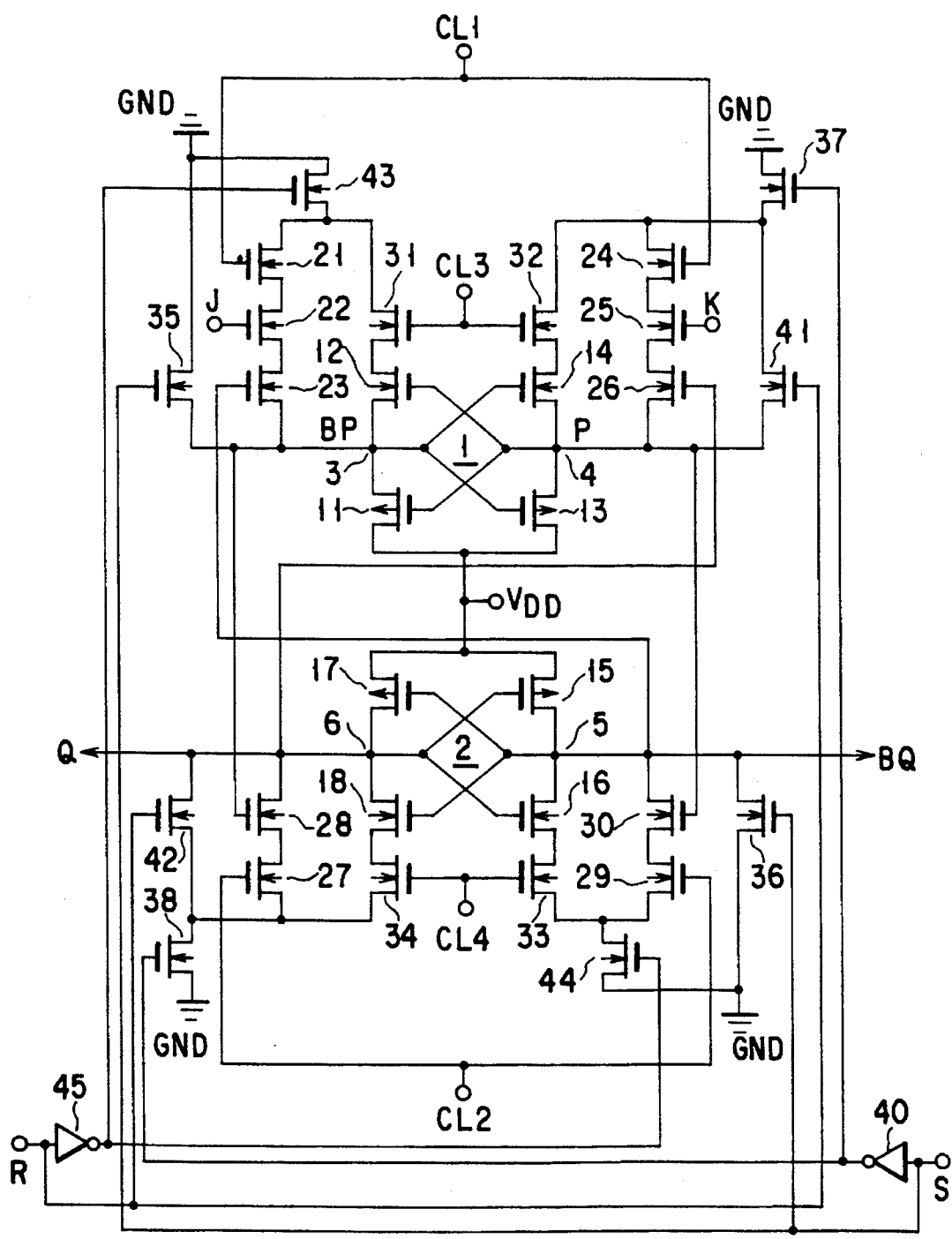
F I G. 11

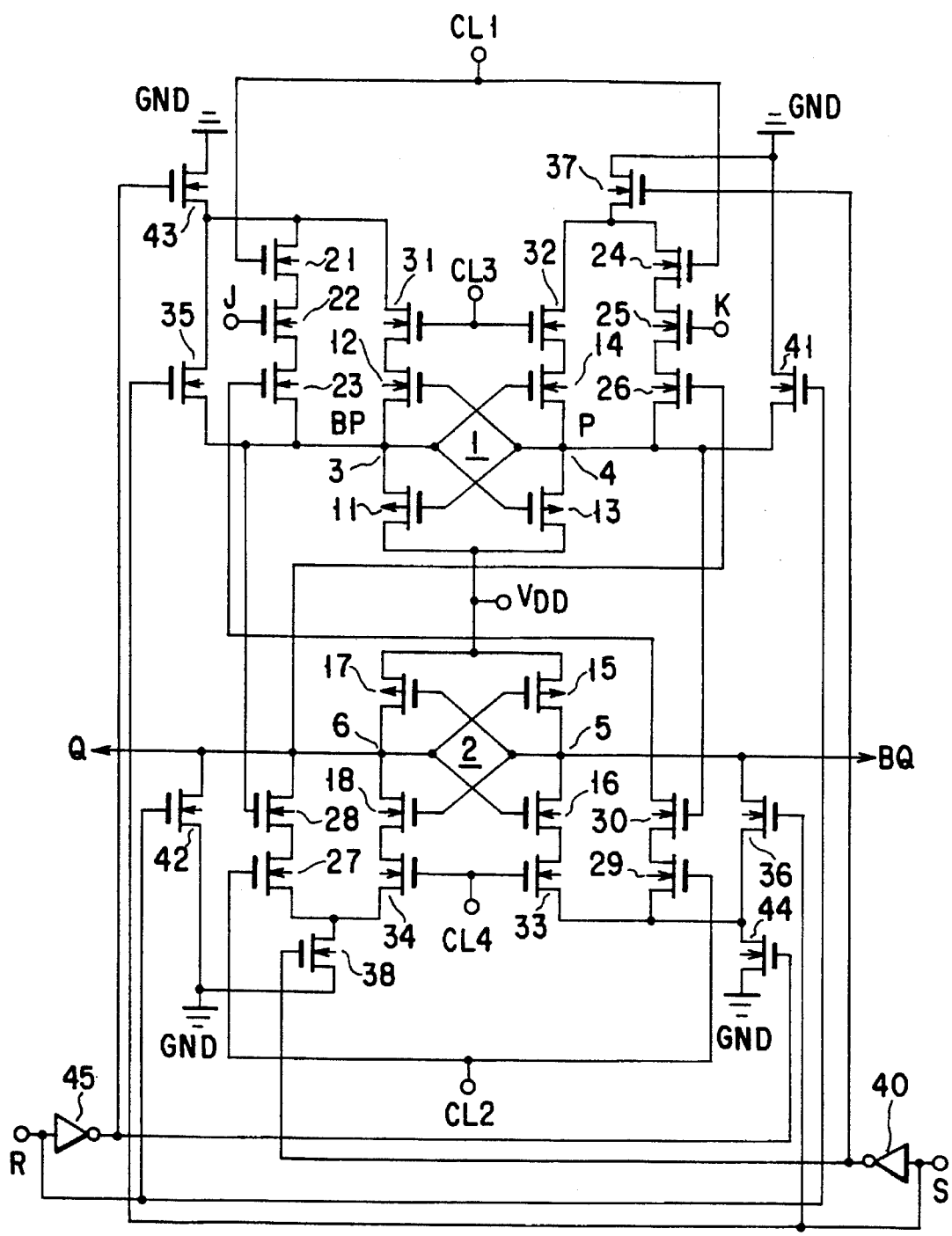
F I G. 12

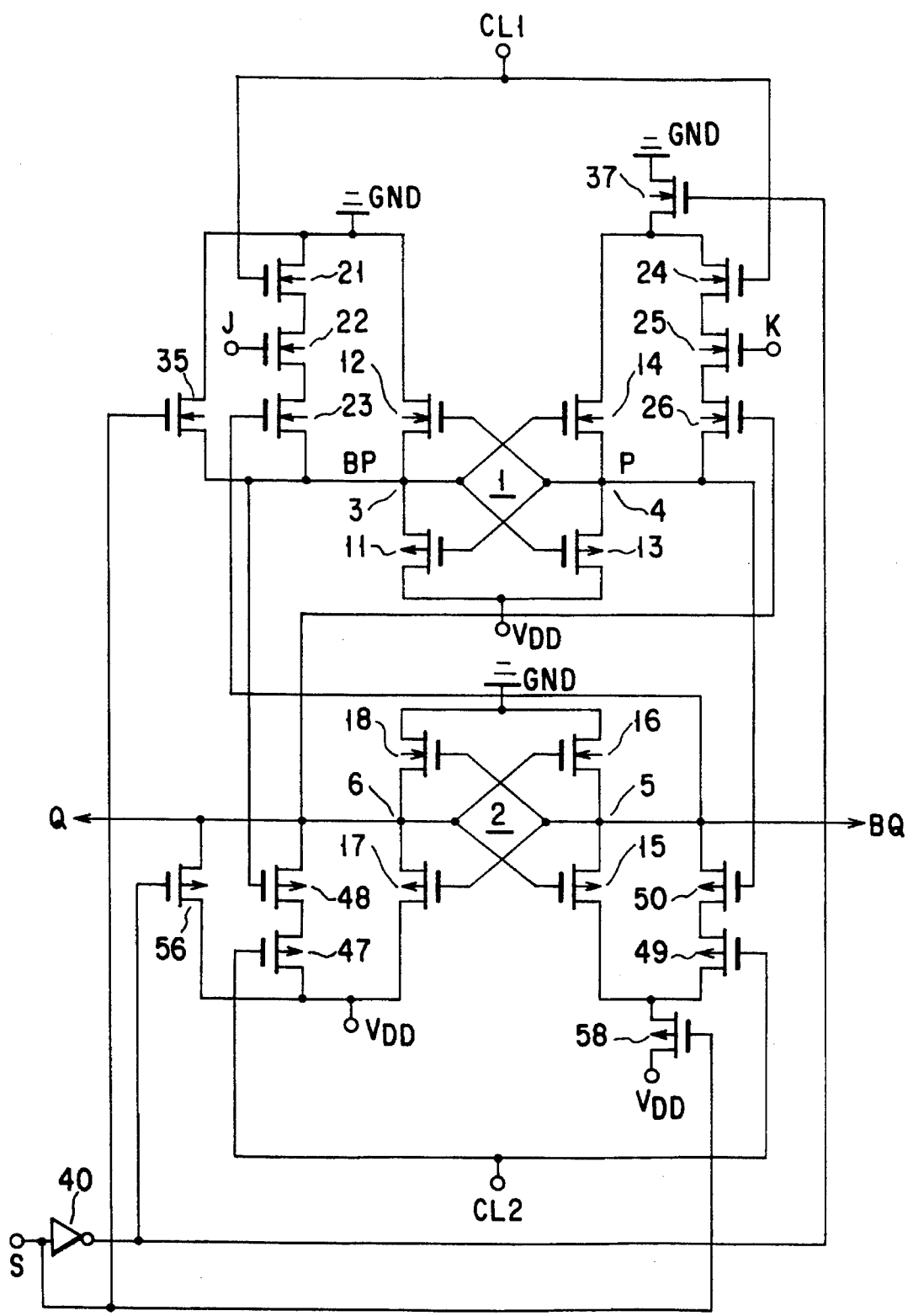
F I G. 15

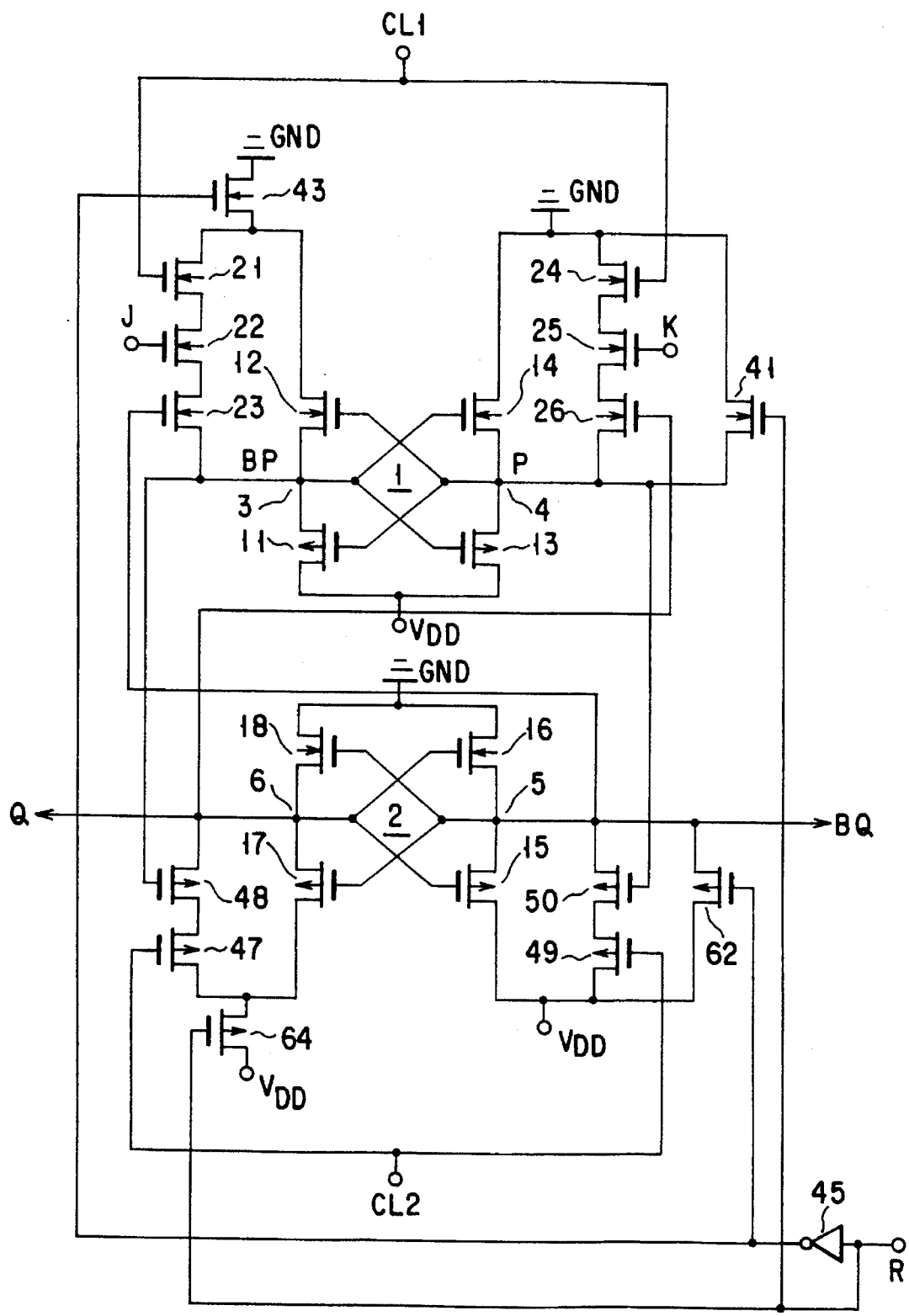
F I G. 16

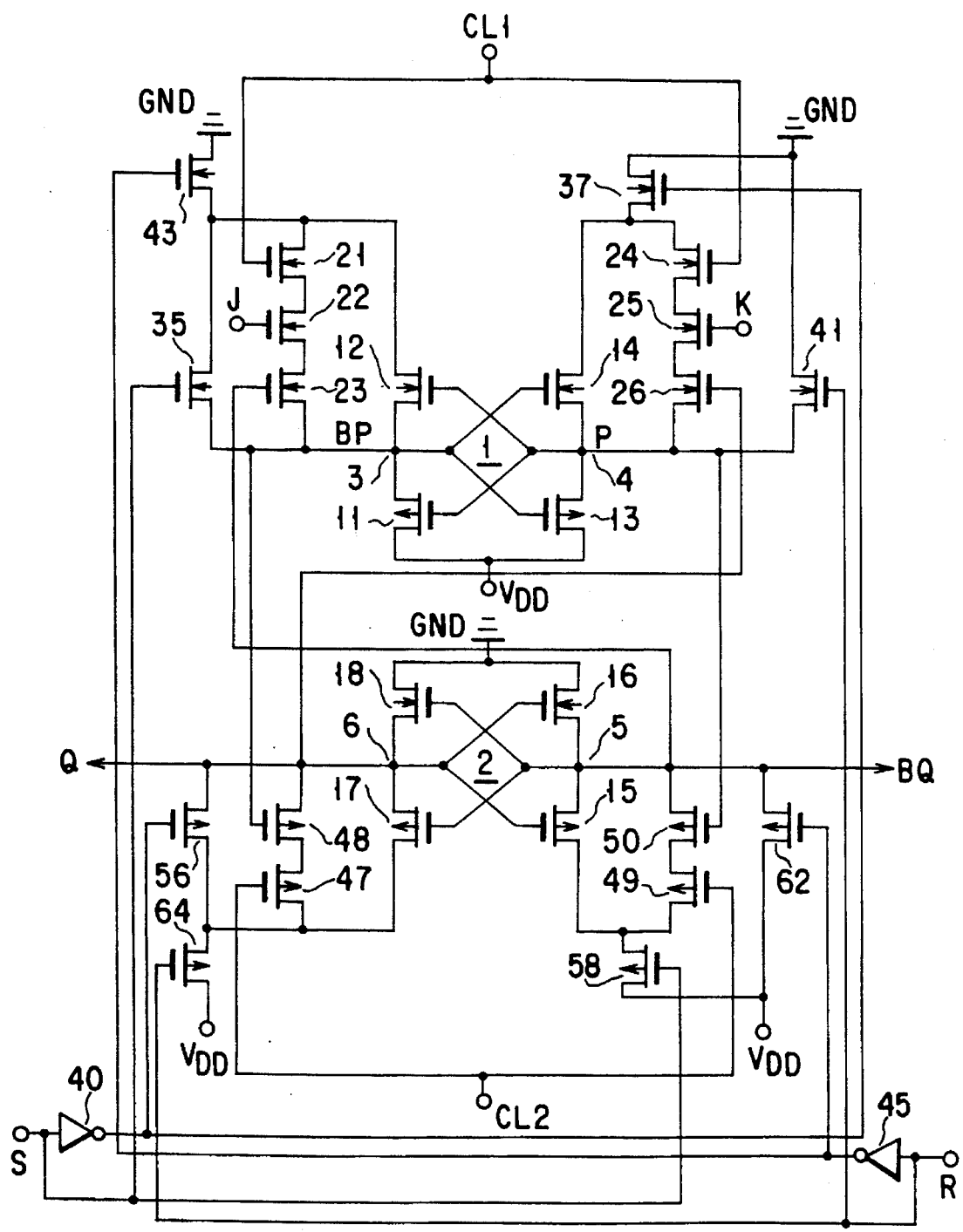
F I G. 18

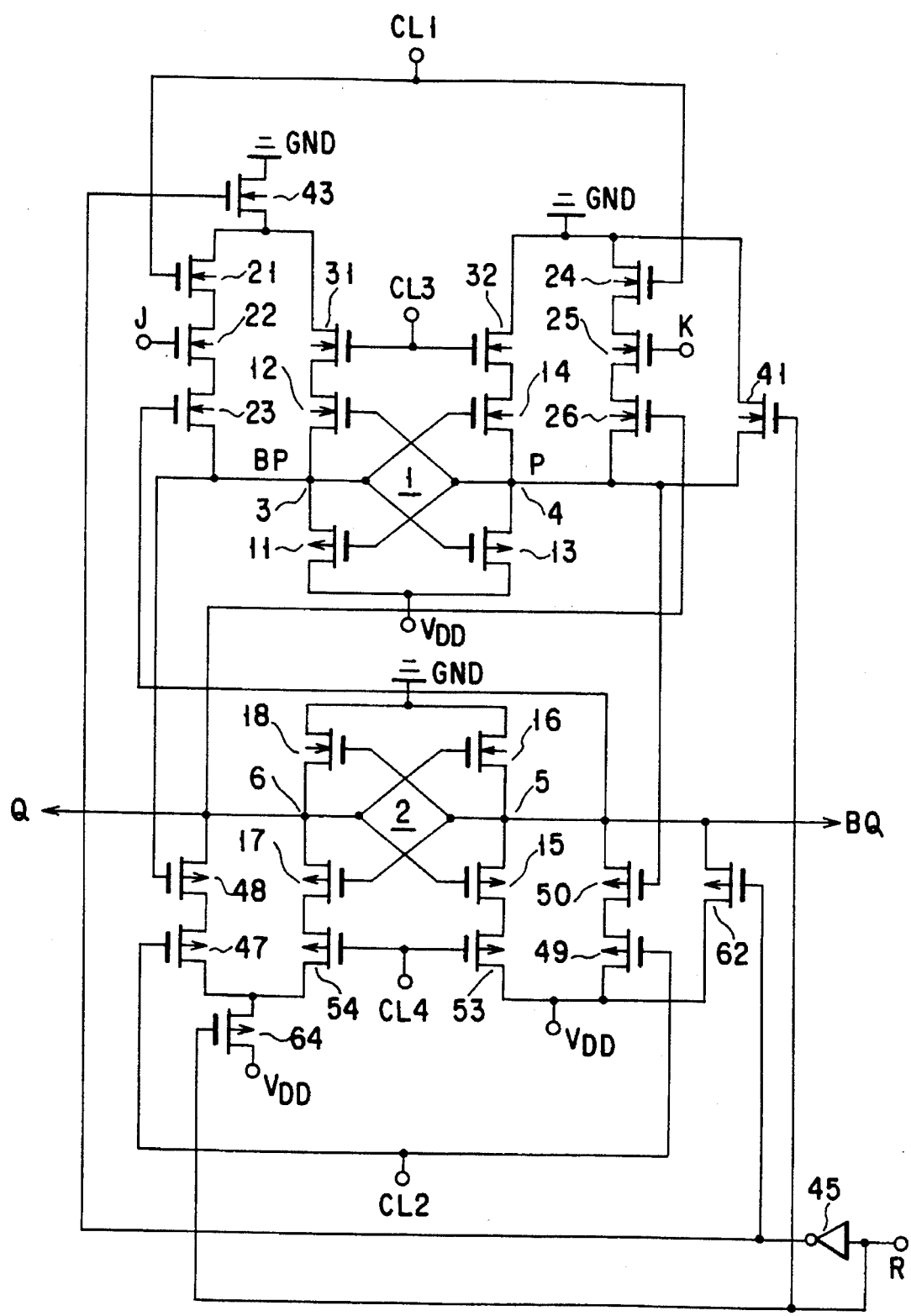
F I G. 20

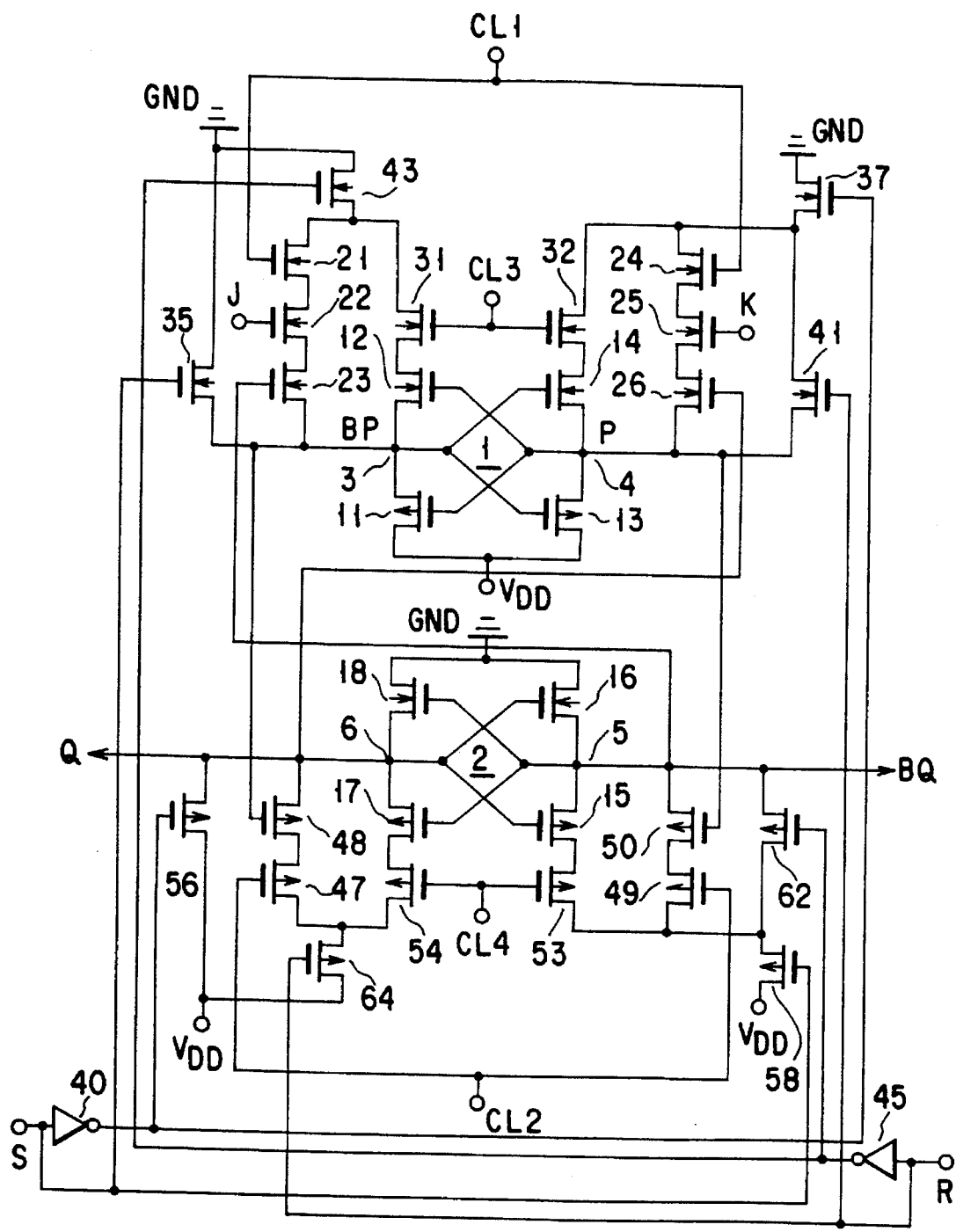
F I G. 21

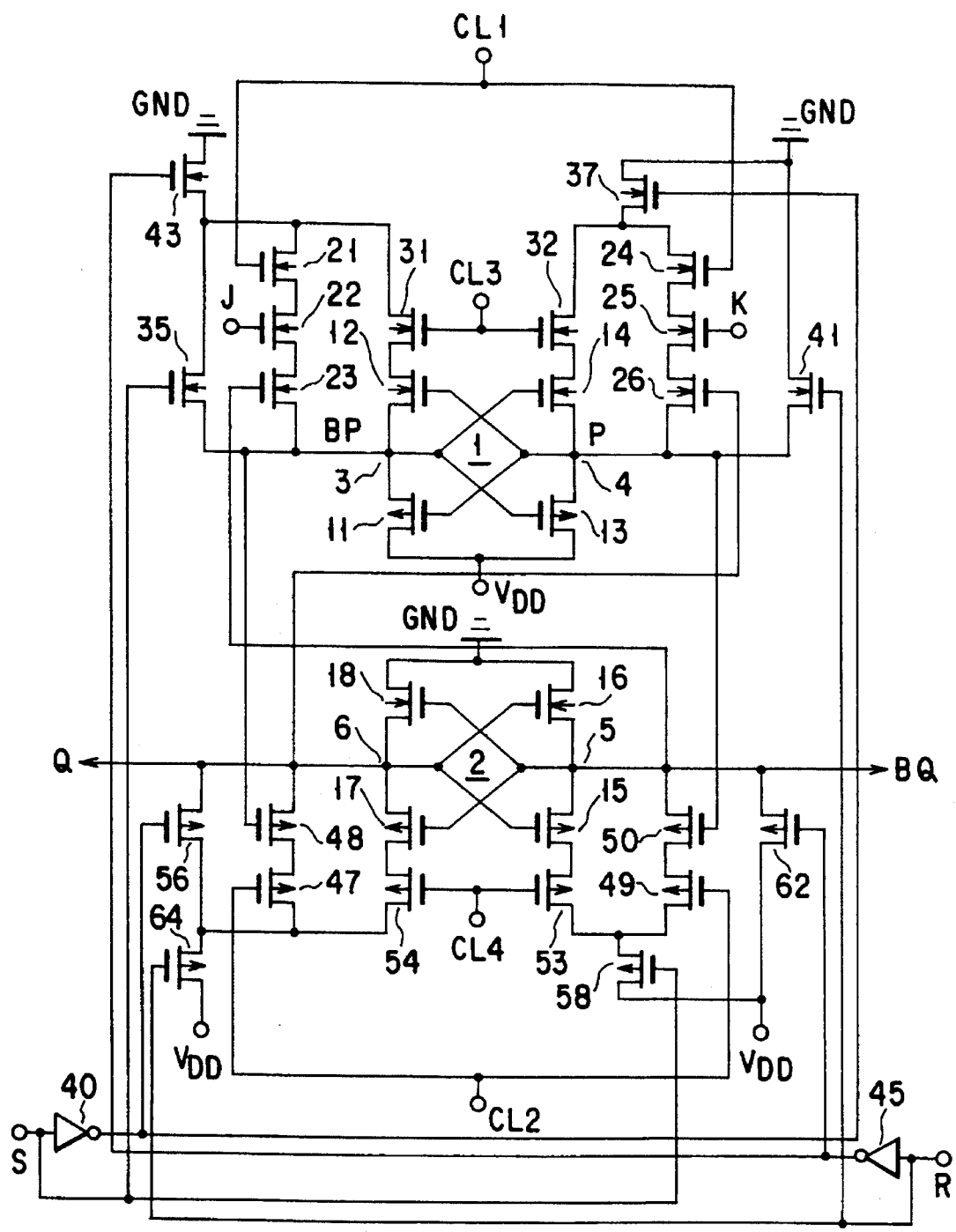
F I G. 22

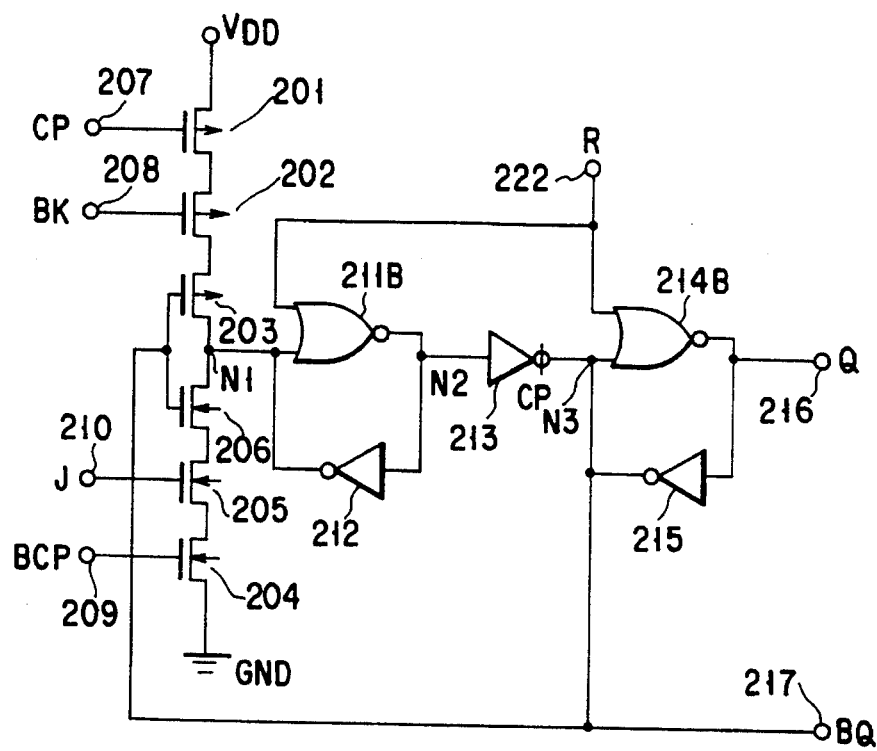
F I G. 25
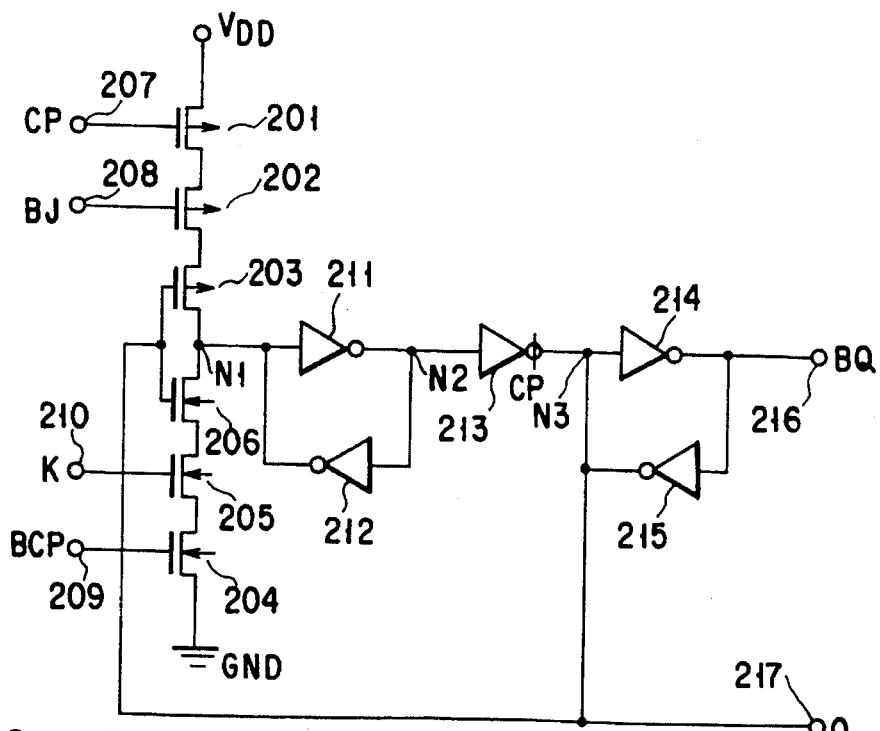
F I G. 26

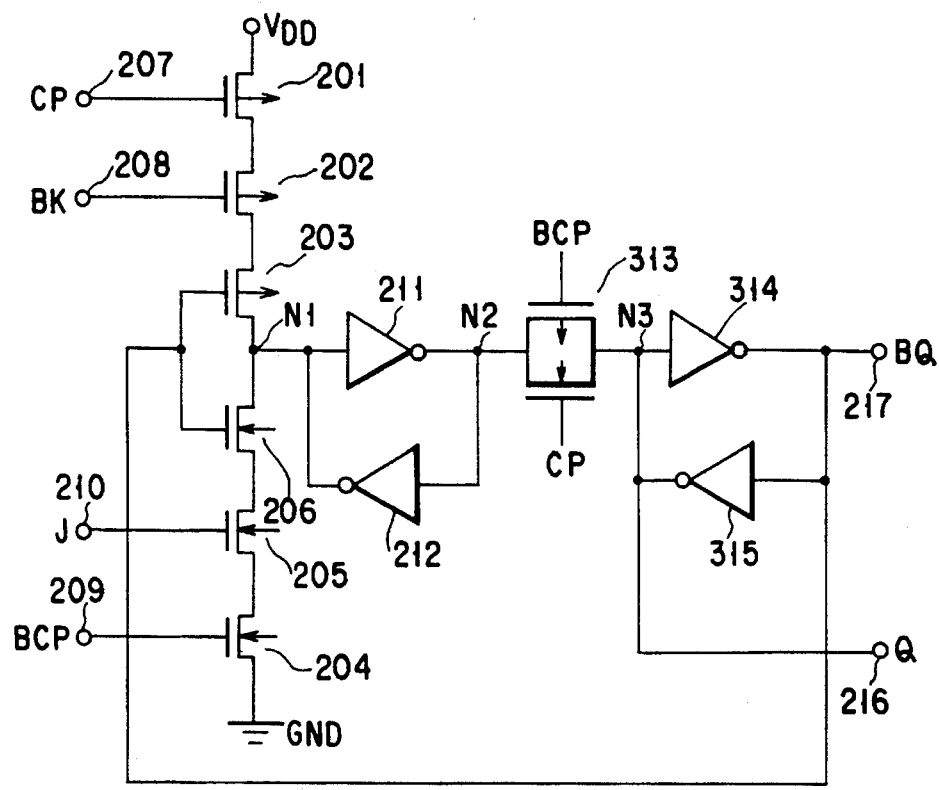
F I G. 29
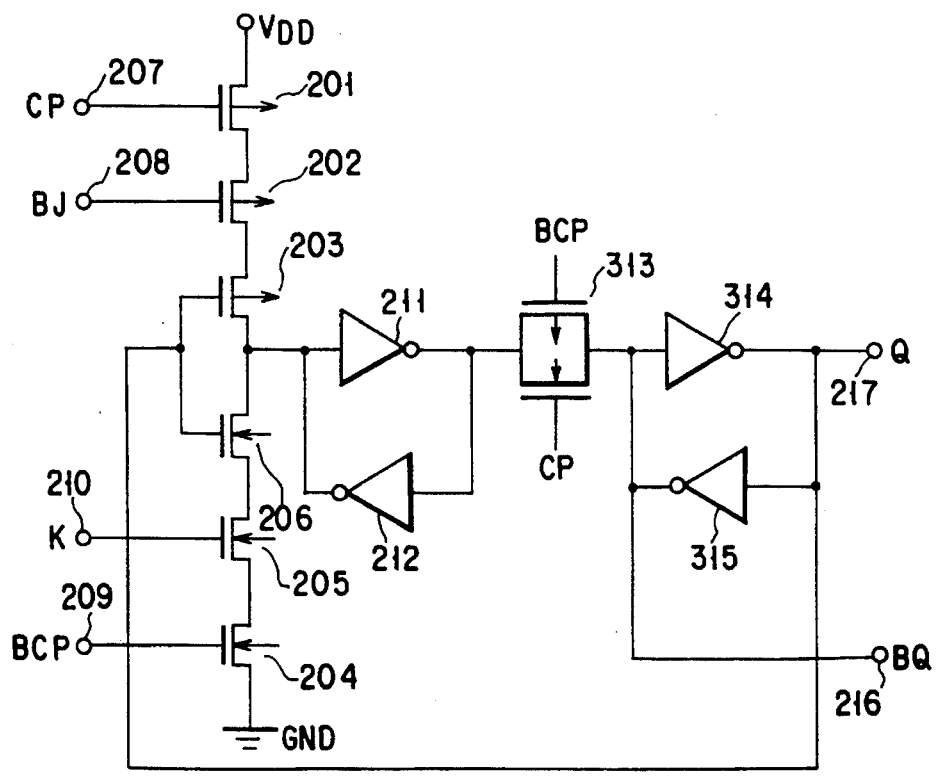
F I G. 30

5,532,634

HIGH-INTEGRATION J-K FLIP-FLOP CIRCUIT

BACKGROUND OF THE INVENTION

1. Field of the Invention

The present invention relates to a CMOS J-K flip-flop circuit built in, especially, an integrated circuit.

2. Description of the Related Art

FIG. 1 is a circuit diagram showing the first arrangement of a conventional J-K flip-flop circuit. The output from a NOR gate 101 is connected to the NOR input of an AND.NOR composite gate 102, and the output from the composite gate 102 is connected to the input of a CMOS clocked inverter 103. The output from the clocked inverter 103 is connected to one latch node of a flip-flop 104 as a master flip-flop obtained by connecting the inputs and outputs of two inverters to each other. The other latch node of the flip-flop 104 is connected to the input of a CMOS clocked inverter 105. The output from the clocked inverter 105 is connected to an output BQ as one latch node of a flip-flop 106 which serves as a slave flip-flop obtained by connecting the inputs and outputs of two inverters to each other. The other latch node of the flip-flop 106 is an output Q, and becomes one input of the NOR gate 101 and one AND input of the composite gate 102. The other input of the NOR gate 101 is a J signal input, and the other AND input of the composite gate is a K signal input. The outputs of this circuit become outputs Q and BQ (inverted Q) of the flip-flop 107.

FIG. 2 is a circuit diagram showing the second arrangement of a conventional J-K flip-flop circuit. The outputs from 3-input NAND gates 111 and 112 are respectively connected to the reset and set inputs of a master R-S flip-flop constituted by NAND gates 113 and 114, and the outputs from this flip-flop are connected to one-inputs of NAND gates 115 and 116. The outputs from the NAND gates 115 and 116 are respectively connected to the reset and set inputs of a slave R-S flip-flop constituted by NAND gates 117 and 118. Outputs Q and BQ of this flip-flop become the circuit outputs. The output Q is connected to the first input of the NAND gate 112, and the output BQ is connected to the first input of the NAND gate 111. The second inputs of the NAND gates 111 and 112 are respectively J and K inputs, and their third inputs are inputs of a clock pulse $\phi 1$. A clock pulse $\phi 2$ is input to the other inputs of the NAND gates 115 and 116.

In each of the above-mentioned circuit arrangements, the J and K inputs are fetched by the master flip-flop by an inverter operation in response to the clock pulses CP and BCP (inverted CP) or a gate operation in response to the clock pulses $\phi 1$ and $\phi 2$, and are shifted to the slave flip-flop to obtain the outputs Q and BQ.

Problems of the above-mentioned circuits are as follows. As the first problem, since the circuit is constituted by a large number of transistors, it requires a large area when it is built in an LSI, resulting in a high-cost LSI. In the conventional circuit described above, P- and N-channel MOS transistors are complementarily built in, and their numbers are almost equal to each other. If a CMOS inverter constituted by two transistor elements is connected to one input line to a gate circuit, 26 transistors are required for constituting the circuit shown in FIG. 1, and 36 transistors are required for constituting the circuit shown in FIG. 2. When the ON resistances of the N- and P-channel MOS transistors are set to be equal to each other, since the mobility of the P-channel MOS transistor is smaller than that of the N-channel MOS transistor, a large size (channel width) must be allotted to the P-channel MOS transistor, resulting in an increase in area of the circuit.

As the second problem, each of the above-mentioned circuit is not suitable for a high-speed operation. Each of the above-mentioned circuit arrangements is designed, so that both the P- and N-channel MOS transistors have the same characteristics, thus attempting to achieve a high-speed operation. A high-speed operation is achieved by setting substantially the same channel lengths and threshold voltages of both the N- and P-channel MOS transistors. However, in practice, the manufacturing processes of P- and N-channel MOS transistors must include processes having different influences for MOS transistor operations, and it is difficult to set these influences (the channel lengths and threshold voltages of the N- and P-channel MOS transistors) to be equal to each other. Therefore, the above-mentioned circuits are not suitable for a high-speed operation.

SUMMARY OF THE INVENTION

The present invention has been made in consideration of the above situation, and has as its object to provide a J-K flip-flop circuit which can reduce the number of elements constituting the circuit and eliminate arrangements having characteristic factors which are not suitable for a high-speed operation, so as to reduce cost of an integrated circuit and to achieve a high-speed operation.

In order to achieve the above object of the present invention, there is provided a J-K flip-flop circuit comprising: first and second flip-flop circuits each of which is constituted by connecting inputs and outputs of two CMOS inverters to each other; first NAND type connection means in which one end of three MOS transistors, which respectively receive a first clock, a J signal, and a signal from one node of the second flip-flop circuit at their gates, and have current paths connected in series with each other, is connected to one node of the first flip-flop circuit; second NAND type connection means in which one end of three MOS transistors, which respectively receive the first clock, a K signal, and a signal from the other node of the second flip-flop circuit at their gates, and have current paths connected in series with each other, is connected to the other node of the first flip-flop circuit; third NAND type connection means in which one end of two MOS transistors, which respectively receive a second clock and a signal from the other node of the first flip-flop circuit at their gates, and have current paths connected in series with each other, is connected to one node of the second flip-flop circuit; and fourth NAND type connection means in which one end of two MOS transistors, which respectively receive the second clock and a signal from one node of the first flip-flop circuit at their gates, and have current paths connected in series with each other, is connected to the other node of the second flip-flop circuit.

According to the present invention, by utilizing the fact that voltages held by latch nodes of the flip-flop circuit must be complementary voltages, circuit means for supplying a logic output of a control signal to a flip-flop circuit is constituted without using any CMOS gate circuits, thereby reducing the number of elements. When the circuit is designed by mainly using N-channel MOS transistors having a large mobility, a high-speed operation can be realized. For this reason, even when the size of each P-channel MOS transistor is increased, the area of the circuit is not increased very much. In manufactured manufacturing process, the circuit can be manufactured in consideration of the characteristics of the N-channel MOS transistors as first priority.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing the arrangement according to the first embodiment of the present invention;

FIGS. 4A and 4B are circuit diagrams showing the arrangements according to the second embodiment of the present invention;

FIG. 6 is a circuit diagram showing the arrangement according to the fourth embodiment of the present invention;

FIG. 7 is a circuit diagram showing the arrangement according to the fifth embodiment of the present invention;

FIG. 9 is a circuit diagram showing the arrangement according to the seventh embodiment of the present invention;

FIG. 10 is a circuit diagram showing the arrangement according to the eighth embodiment of the present invention;

FIG. 11 is a circuit diagram showing the arrangement according to the ninth embodiment of the present invention;

FIG. 12 is a circuit diagram showing the arrangement according to the 10th embodiment of the present invention;

FIG. 15 is a circuit diagram showing the arrangement according to the 13th embodiment of the present invention;

FIG. 16 is a circuit diagram showing the arrangement according to the 14th embodiment of the present invention;

FIG. 18 is a circuit diagram showing the arrangement according to the 16th embodiment of the present invention;

FIG. 20 is a circuit diagram showing the arrangement according to the 18th embodiment of the present invention;

FIG. 21 is a circuit diagram showing the arrangement according to the 19th embodiment of the present invention;

FIG. 22 is a circuit diagram showing the arrangement according to the 20th embodiment of the present invention;

FIG. 25 is a circuit diagram showing the arrangement according to the 23rd embodiment of the present invention;

FIG. 26 is a circuit diagram showing the arrangement according to the 24th embodiment of the present invention;

FIG. 29 is a circuit diagram showing the arrangement according to the 27th embodiment of the present invention; and FIG. 30 is a circuit diagram showing the arrangement according to the 28th embodiment of the present invention.

DETAILED DESCRIPTION OF THE PREFERRED EMBODIMENTS

Figure 1:
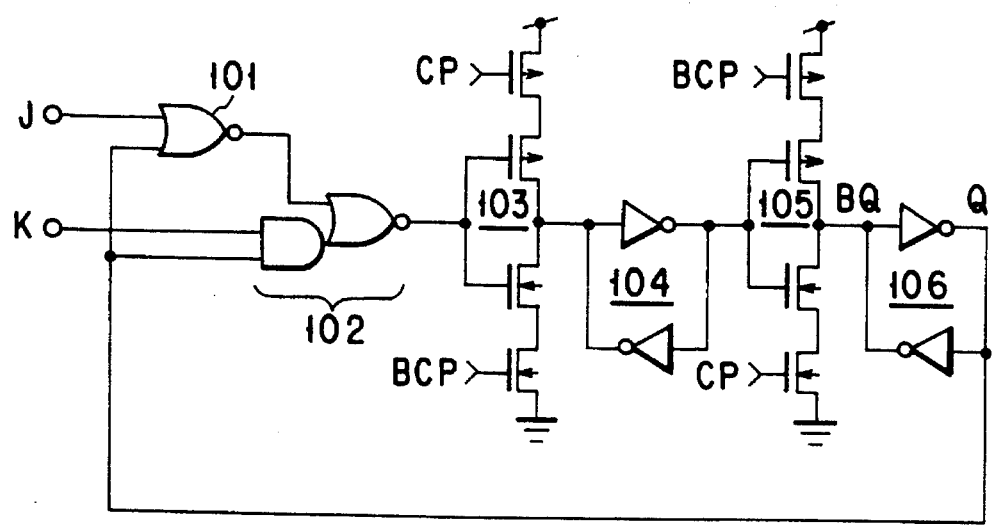
FIG. 1 is a circuit diagram showing the first arrangement of a conventional J-K flip-flop circuit.

FIG. 3 is a circuit diagram showing the arrangement of a J-K flip-flop circuit according to the first embodiment of the present invention. A flip-flop circuit 1 is constituted by connecting, to each other, the input and output terminals of a CMOS inverter constituted by a P-channel MOSFET (to be abbreviated as a P-MOSFET hereinafter) 11 and an N-channel MOSFET (to be abbreviated as an N-MOSFET hereinafter) 12, and a CMOS inverter constituted by P- and N-MOSFETs 13 and 14. The P-MOSFETs 11 and 13 are connected to a power supply voltage VDD, and the N-MOSFETs 12 and 14 are connected to a ground voltage GND. A flip-flop circuit 2 is constituted by connecting, to each other, the input and output terminals of a CMOS inverter constituted by P- and N-MOSFETs 15 and 16, and a CMOS inverter constituted by P- and N-MOSFETs 17 and 18. The P-MOSFETs 15 and 17 are connected to the power supply voltage VDD, and the N-MOSFETs 16 and 18 are connected to the ground voltage GND.

Three N-MOSFETs 21, 22, and 23 are connected in series with each other, and the drain of the N-MOSFET 23 at one end of this series connection is connected to one node (the drains of the P- and N-MOSFETs 11 and 12) 3 of the flip-flop circuit 1. The source of the N-MOSFET 21 at the other end of this series connection is connected to the ground voltage GND. The gate of the N-MOSFET 21 receives a clock signal CL1, the gate of the N-MOSFET 22 receives a J signal, and the gate of the N-MOSFET 23 receives a signal supplied from one node (the drains of the P- and N-MOSFETs 15 and 16) 5 of the flip-flop circuit 2. Three N-MOSFETs 24, 25, and 26 are connected in series with each other, and the drain of the N-MOSFET 26 at one end of this series connection is connected to the other node (the drains of the P- and N-MOSFETs 13 and 14) 4 of the flip-flop circuit 1. The source of the N-MOSFET 24 at the other end of this series connection is connected to the ground voltage GND. The gate of the N-MOSFET 24 receives the clock signal CL1, the gate of the N-MOSFET 25 receives a K signal, and the gate of the N-MOSFET 26 receives a signal supplied from the other node (the drains of the P- and N-MOSFETs 17 and 18) 6 of the flip-flop circuit 2.

Two N-MOSFETs 27 and 28 are connected in series with each other, and the drain of the N-MOSFET 28 at one end of this series connection is connected to the other node 6 of the flip-flop circuit 2. The source of the N-MOSFET 27 at the other end of this series connection is connected to the ground voltage GND. The gate of the N-MOSFET 27 receives a clock signal CL2, and the gate of the N-MOSFET 28 receives a signal supplied from one node 3 of the flip-flop circuit 1. Two N-MOSFETs 29 and 30 are connected in series with each other, and the drain of the N-MOSFET 30 at one end of this series connection is connected to one node 5 of the flip-flop circuit 2. The source of the N-MOSFET 29 at the other end of this series connection is connected to the ground voltage GND. The gate of the N-MOSFET 29 receives the clock signal CL2, and the gate of the N-MOSFET 30 receives a signal supplied from the other node 4 of the flip-flop circuit 1.

The circuit operation of the arrangement shown in FIG. 3 will be described below when both the J and K signals are at low logic level (to be referred to as "L" hereinafter), even when the clock CL1 is at high logic level (to be referred to as "H" hereinafter), the two nodes 3 (output BP) and 4 (output P) of the flip-flop circuit 1 do not change (the output BP is the inverted signal of the output P). Therefore, when the next clock CL2 is at "H", the two nodes 6 and 5 of the flip-flop circuit 2, i.e., circuit outputs Q and BQ (the output BQ is the inverted signal of the output Q) do not change, and the previous state is held.

A case will be described below wherein the J signal is at "H" and the K signal is at "L". While the node 5 (BQ) of the flip-flop circuit 2 is at "H", when the clock CL1 goes to "H", the series-connected N-MOSFETs 21, 22, and 23 are turned on, the node 3 (BP) goes to "L", and the P-MOSFET 13 is turned on. As a result, the node 4 (P) goes to "H". When the next clock CL2 goes to "H", since the series-connected N-MOSFETs 29 and 30 are turned on, the node 5, i.e., the output BQ goes to "L", and the P-MOSFET 17 is turned on. Hence, the node 6 of the flip-flop circuit 2, i.e., the output Q goes to "H". When this output Q is at "H", neither the node 3 nor the node 4 changes even when the clock CL1 is at "H", and the outputs Q and BQ do not change even when the next clock CL2 is at "H". Thus, the output Q remains at "H", and the output BQ remains at "L".

A case will be described below wherein the J signal is at "L" and the K signal is at "H". While the node 6 (Q) of the flip-flop circuit 2 is at "H", when the clock CL1 goes to "H", the series-connected N-MOSFETs 24, 25, and 26 are turned on, the node 4 (P) goes to "L", and the P-MOSFET 11 is turned on. As a result, the node 3 (BP) goes to "H". When the next clock CL2 goes to "H", since the series-connected N-MOSFETs 27 and 28 are turned on, the node 6 goes to "L", and hence, the P-MOSFET 15 is turned on. As a result, the node 5 of the flip-flop circuit 2, i.e., the output BQ goes to "H". When the output Q is at "L", the nodes 3 and 4 do not change even when the clock CL1 goes to "H", and the outputs Q and BQ do not change even when the next clock CL2 is at "H". Therefore, the output Q remains at "L", and the output BQ remains at "H".

A case will be described below wherein both the J and K signals are at "H". While the node 6 (Q) of the flip-flop circuit 2 is at "H", when the clock CL1 goes to "H", the series-connected N-MOSFETs 24, 25, and 26 are turned on, the node 4 (P) goes to "L", and the P-MOSFET 11 is turned on. As a result, the node 3 (BP) goes to "H". When the next clock CL2 goes to "H", the series-connected N-MOSFETs 27 and 28 are turned on, the node 6 goes to "L", and hence, the P-MOSFET 15 is turned on. As a result, the node 5 goes to "H". Therefore, and the output Q goes to "L", and the output BQ goes to "H". When both the J and K signals are at "H", and the node 6 (Q) of the flip-flop circuit 2 is at "L" (BQ is "H"), if the clock CL1 goes to "H", the series-connected N-MOSFETs 21, 22, and 23 are turned on, the node 3 (BP) goes to "L", and the P-MOSFET 13 is turned on. As a result, the node 4 (P) goes to "H". When the next clock CL2 goes to "H", since the series-connected N-MOSFETs 29 and 30 are turned on, the node 5 goes to "L", and hence, the P-MOSFET 17 is turned on. As a result, the node 6 goes to "H". Therefore, the output Q goes to "H", and the output BQ goes to "L".

As described above, according to the circuit of the embodiment shown in FIG. 3, "L"-level J and K inputs hold the previous state. On the other hand, complementary J and K inputs are read by the flip-flop circuit 1 (master) in response to the clock CL1, are shifted to the flip-flop circuit 2 (slave) in response to the clock CL2, and appear as the outputs Q and BQ. "H"-level J and K inputs invert and output held data. As a result, the circuit of this embodiment serves as a J-K flip-flop. In this embodiment, the clocks CL1 and CL2 can be complementary signals.

FIG. 4A is a circuit diagram showing the arrangement of a J-K flip-flop circuit according to the second embodiment of the present invention. In addition to the arrangement shown in FIG. 3, N-MOSFETs 31 to 34 are added to the flip-flop circuits 1 and 2 to prevent a short-circuit current from the power supply voltage VDD to the ground voltage GND side during an operation. More specifically, the drain-source path of the N-MOSFET 31 is connected between the N-MOSFET 12 and the ground voltage GND, and the drain-source path of the N-MOSFET 32 is connected between the N-MOSFET 14 and the ground voltage GND. The gates of the N-MOSFETs 31 and 32 are commonly connected, and are ON/OFF controlled by a clock CL3. The drain-source path of the N-MOSFET 33 is connected between the N-MOSFET 16 and the ground voltage GND, and the drain-source path of the N-MOSFET 34 is connected between the N-MOSFET 18 and the ground voltage GND. The gates of the N-MOSFETs 33 and 34 are commonly connected, and are ON/OFF controlled by a clock CL4. The clock signal CL3 is a signal which goes to "L" when the above-mentioned clock signal CL1 changes from "L" to "H". The clock signal CL4 is a signal which goes to "L" when the above-mentioned clock signal CL2 changes from "L" to "H".

According to the arrangement shown in FIG. 4A, when, for example, the node 4 changes from "H" to "L" in the arrangement shown in FIG. 3, the P-MOSFET 11 changes from an OFF state to an ON state, and the N-MOSFET 12 changes from an ON state to an OFF state. During this transient period, the MOSFETs 11 and 12 are simultaneously in an ON state at a given timing. A short-circuit current flowing between VDD and GND in this state can be prevented by transfer control of the N-MOSFET 31. Since the remaining N-MOSFETs 32 to 34 have the same function, a detailed description thereof will be omitted.

Figure 4B:
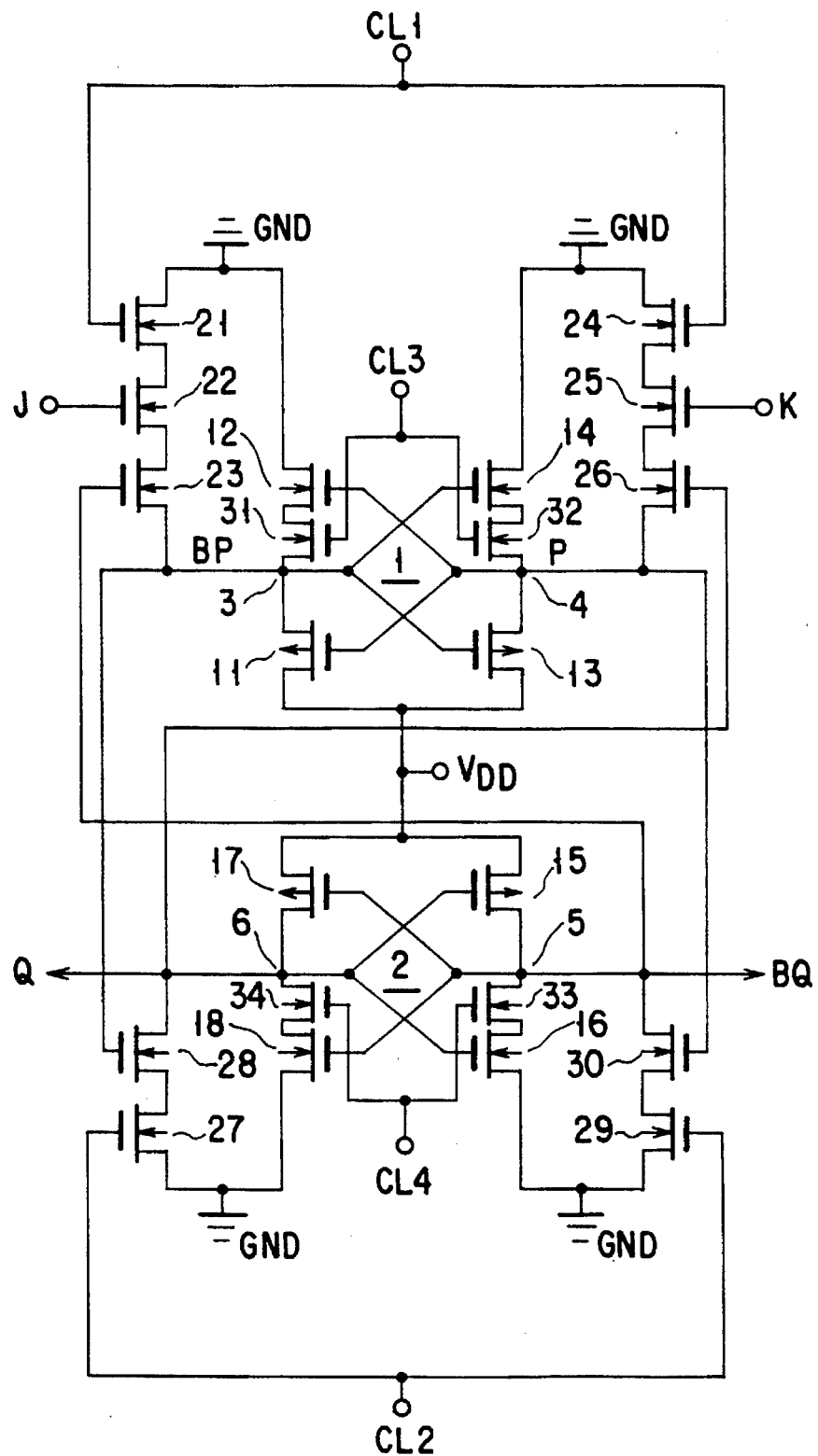

The connected positions of the N-MOSFETs 31 to 34 in the arrangement shown in FIG. 4A may be respectively changed to a position between the node 3 and the N-MOSFET 12, a position between the node 4 and the N-MOSFET 14, a position between the node 5 and the N-MOSFET 16, and a position between the node 6 and the N-MOSFET 18, thus obtaining the same effect as described above (see FIG. 4B). In the embodiment shown in FIG. 3, the short-circuit current can be eliminated by setting sufficiently large ON resistances of the N-MOSFETs 12, 14, 16, and 18.

Figure 5:
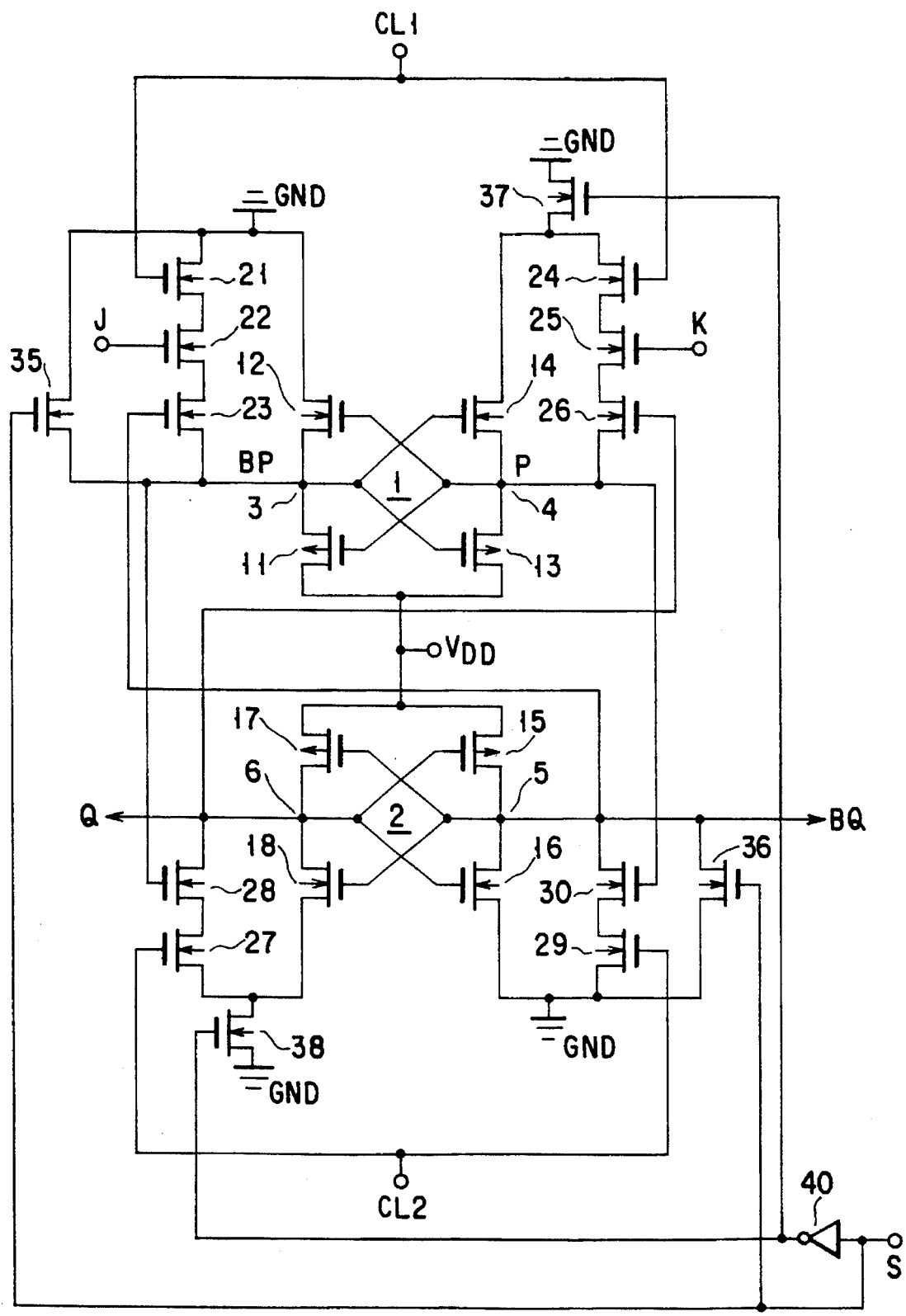
FIG. 5 is a circuit diagram showing the arrangement according to the third embodiment of the present invention.

FIG. 5 is a circuit diagram showing the arrangement of a J-K flip-flop circuit according to the third embodiment of the present invention. In order to provide a set input function to the flip-flop circuits 1 and 2, N-MOSFETs 35 to 38 are added to the arrangement shown in FIG. 3. More specifically, the drain-source path of the N-MOSFET 35 is connected between the node 3 of the flip-flop circuit 1 and the ground voltage GND, and the drain-source path of the N-MOSFET 36 is connected between the node 5 of the flip-flop circuit 2 and the ground voltage GND. The gates of the N-MOSFETs 35 and 36 are applied with a set signal S. The drain-source path of the N-MOSFET 37 is connected between the sources of the N-MOSFETs 14 and 24 and the ground voltage GND, and the drain-source path of the N-MOSFET 38 is connected between the sources of the N-MOSFETs 18 and 27 and the ground voltage GND. The gates of the N-MOSFETs 37 and 38 are applied with an inverted signal BS of the set signal S. An inverter 40 is arranged to invert the signal S.

According to the arrangement shown in FIG. 5, when the set signal S goes to "H", the N-MOSFETs 35 and 36 are turned on, and the N-MOSFETs 37 and 38 are turned off. Therefore, since the node 3 goes to "L", the P-MOSFET 13 is turned on, and the node 4 goes to "H". On the other hand, since the node 5 (BQ) goes to "L", the P-MOSFET 17 is turned on, and the node 6 (Q) goes to "H". In this manner, a set state is established.

FIG. 6 is a circuit diagram showing the arrangement Of a J-K flip-flop circuit according to the fourth embodiment of the present invention. In order to provide a reset input function to the flip-flop circuits 1 and 2, N-MOSFETs 41 to 44 are added to the arrangement shown in FIG. 3. More specifically, the drain-source path of the N-MOSFET 41 is connected between the node 4 of the flip-flop circuit 1 and the ground voltage GND, and the drain-source path of the N-MOSFET 42 is connected between the node 6 of the flip-flop circuit 2 and the ground voltage GND. The gates of the N-MOSFETs 41 and 42 are applied with a reset signal R. The drain-source path of the N-MOSFET 43 is connected between the sources of the N-MOSFETs 12 and 21 and the ground voltage GND, and the drain-source path of the N-MOSFET 44 is connected between the sources of the N-MOSFETs 16 and 29 and the ground voltage GND. The gates of the N-MOSFETs 43 and 44 are applied with an inverted signal BR of the reset signal R. An inverter 45 is arranged to invert the signal R.

According to the arrangement shown in FIG. 6, when the reset signal R goes to "H", the N-MOSFETs 41 and 42 are turned on, and the N-MOSFETs 43 and 44 are turned off. Therefore, since the node 4 goes to "L", the P-MOSFET 11 is turned on, and the node 3 goes to "H". On the other hand, since the node 6 (Q) goes to "L", the P-MOSFET 15 is turned on, and the node 5 (BQ) goes to "H". Thus, a reset state is established.

FIG. 7 is a circuit diagram showing the arrangement of a J-K flip-flop circuit according to the fifth embodiment of the present invention. In this embodiment, the set input function shown in FIG. 5 is provided to the arrangement shown in FIG. 6. More specifically, in the arrangement in FIG. 6, the drain-source path of the N-MOSFET 35 is connected between the node 3 and the ground voltage GND, and the drain-source path of the N-MOSFET 36 is connected between the node 5 and the ground voltage GND. The gates of the N-MOSFETs 35 and 36 are applied with the set signal S. The drain-source path of the N-MOSFET 37 is connected between the sources of the N-MOSFETs 14, 24, and 41, and the ground voltage GND, and the drain-source path of the N-MOSFET 38 is connected between the sources of the N-MOSFETs 18, 27, and 42, and the ground voltage GND. The gates of the N-MOSFETs 37 and 38 are applied with the inverted signal BS of the set signal S via the inverter 40. According to the above-mentioned arrangement, when the set and reset signals S and R simultaneously go to "H", the set signal S has priority over the reset signal R.

Figure 8:
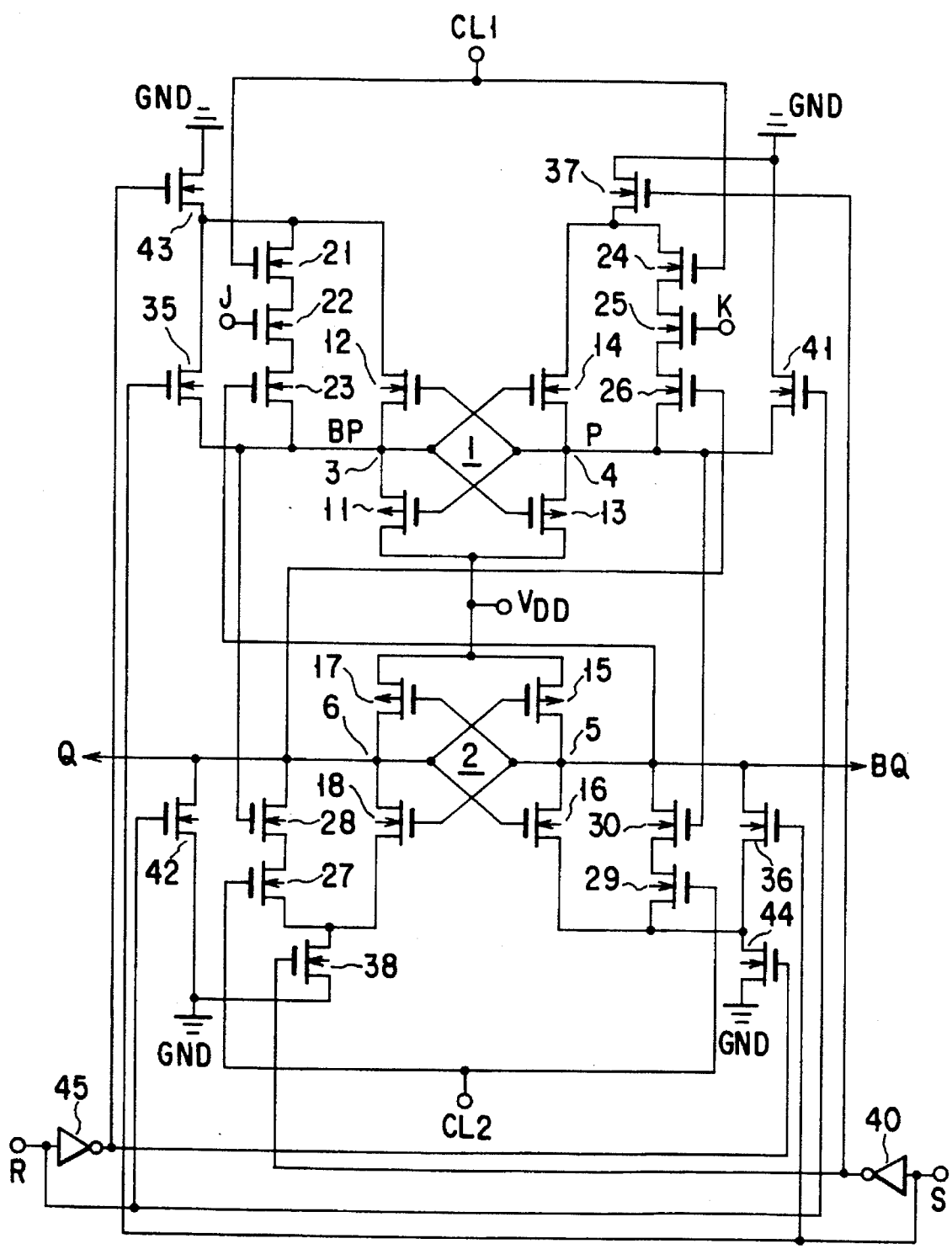
FIG. 8 is a circuit diagram showing the arrangement according to the sixth embodiment of the present invention.

FIG. 8 is a circuit diagram showing the arrangement of a J-K flip-flop circuit according to the sixth embodiment of the present invention. In this embodiment, the reset input function shown in FIG. 6 is provided to the arrangement shown in FIG. 5. More specifically, in the arrangement shown in FIG. 5, the drain-source path of the N-MOSFET 41 is connected between the node 4 and the ground voltage GND, and the drain-source path of the N-MOSFET 42 is connected between the node 6 and the ground voltage GND. The gates of the N-MOSFETs 41 and 42 are applied with the reset signal R. The drain-source path of the N-MOSFET 43 is connected between the sources of the N-MOSFETs 12, 21, and 35, and the ground voltage GND, and the drain-source path of the N-MOSFET 44 is connected between the sources of the N-MOSFETs 16, 29, and 36, and the ground voltage GND. The gates of the N-MOSFETs 43 and 44 are applied with the inverted signal BR of the reset signal R via the inverter 45. According to the above-mentioned arrangement, when the set and reset signals S and R simultaneously go to "H", the reset signal R has priority over the set signal S.

FIG. 9 is a circuit diagram showing the arrangement of a J-K flip-flop circuit according to the seventh embodiment of the present invention. In this embodiment, the arrangement for preventing a short-circuit current shown in FIG. 4A is combined with the arrangement shown in FIG. 5.

FIG. 10 is a circuit diagram showing the arrangement of a J-K flip-flop circuit according to the eighth embodiment of the present invention. In this embodiment, the arrangement for preventing a short-circuit current shown in FIG. 4A is combined with the arrangement shown in FIG. 6.

FIG. 11 is a circuit diagram showing the arrangement of a J-K flip-flop circuit according to the ninth embodiment of the present invention. In this embodiment, the arrangement for preventing a short-circuit current shown in FIG. 4A is combined with the arrangement shown in FIG. 7.

FIG. 12 is a circuit diagram showing the arrangement of a J-K flip-flop circuit according to the 10th embodiment of the present invention. In this embodiment, the arrangement for preventing a short-circuit current shown in FIG. 4A is combined with the arrangement shown in FIG. 8.

In each of the embodiments shown in FIGS. 9 to 12, the arrangement for preventing a short-circuit current shown in FIG. 4A is combined. In place of the arrangement shown in FIG. 4A, the arrangement for preventing a short-circuit current shown in FIG. 4B may be combined with each of the arrangements shown in FIGS. 9 to 12 (the combined arrangements are not shown).

Figure 2:
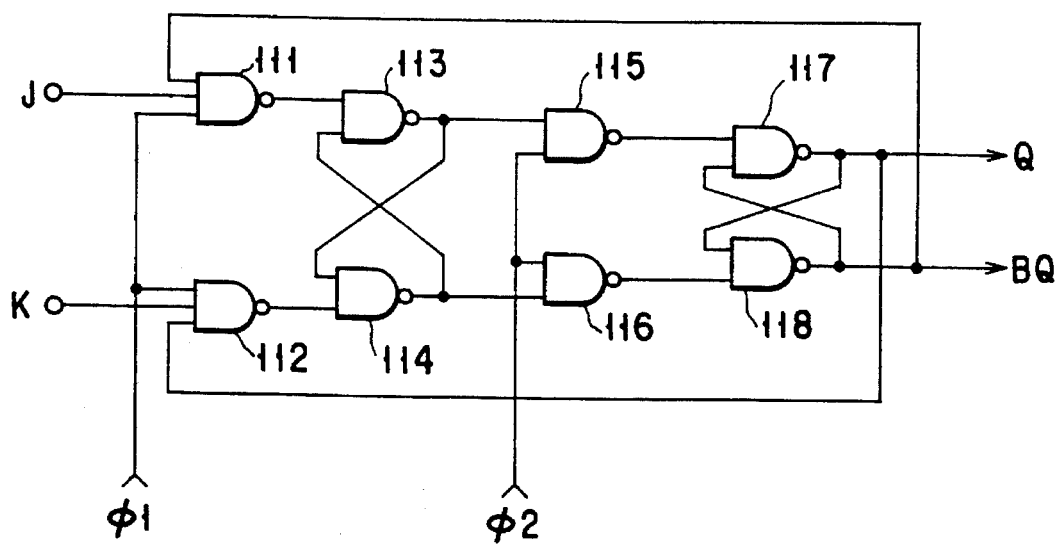
FIG. 2 is a circuit diagram showing the second arrangement of a conventional J-K flip-flop circuit.

According to each of the above embodiments, since the circuit is designed by mainly using N-channel MOS transistors having a large mobility, a high-speed operation can be achieved, and the number of elements can be greatly reduced. The circuit arrangement shown in FIG. 3 can be constituted by 18 transistor elements, and the required area can be remarkably decreased as compared to the conventional 26 elements (FIG. 1) and 36 elements (FIG. 2), thus also reducing cost. Since the number of P-channel MOS transistors themselves is small, even when the size of each P-channel MOS transistor is increased to allow its operation to match the N-channel MOS transistor having a large mobility, the required area is not influenced very much. In the manufacturing process, the circuit can be manufactured in consideration of the characteristics of the N-channel MOS transistors as first priority.

Figure 13:
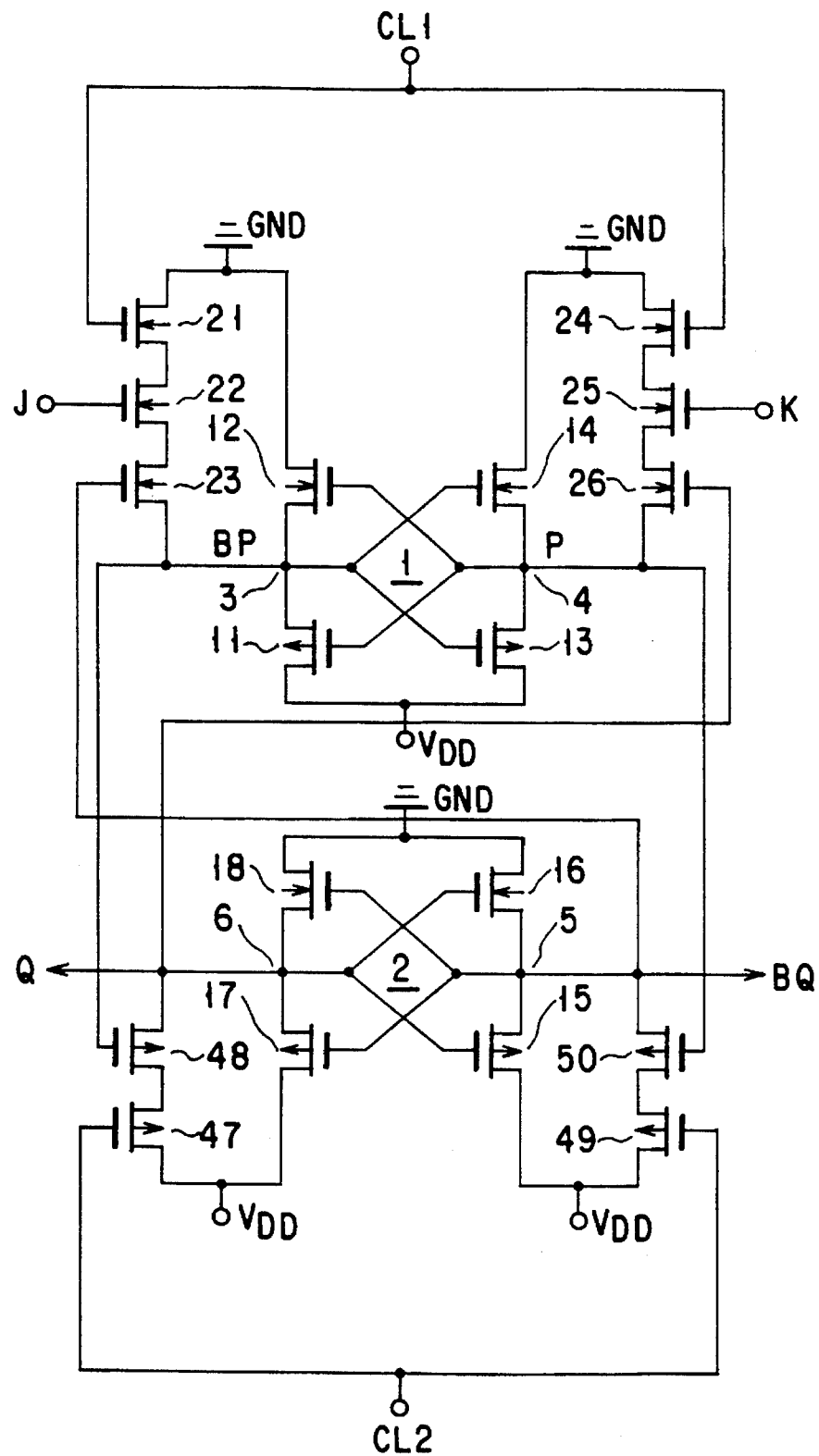
FIG. 13 is a circuit diagram showing the arrangement according to the 11th embodiment of the present invention.

FIG. 13 is a circuit diagram showing the arrangement of a J-K flip-flop circuit according to the 11th embodiment of the present invention. In this embodiment, the operation of the flip-flop circuit 2 in the arrangement shown in FIG. 3 is changed to a negative logic operation. More specifically, in the operation of the flip-flop circuit 2 in FIG. 3, the N-MOSFETs 27 to 30 are used. In place of these MOSFETs, P-MOSFETs 47 to 50 are used in FIG. 13. More specifically, two P-MOSFETs 47 and 48 are connected in series with each other, and the drain of the P-MOSFET 48 at one end of this series connection is connected to the other node 6 of the flip-flop circuit 2. The source of the P-MOSFET 47 at the other end of this series connection is connected to the power supply voltage VDD. The gate of the P-MOSFET 47 receives the clock signal CL2, and the gate of the P-MOSFET 48 receives a signal supplied from one node 3 of the flip-flop circuit 1. Two P-MOSFETs 49 and 50 are connected in series with each other, and the drain of the P-MOSFET 50 at one end of this series connection is connected to one node 5 of the flip-flop circuit 2. The source of the P-MOSFET 49 at the other end of this series connection is connected to the power supply voltage VDD. The gate of the P-MOSFET 49 receives the clock signal CL2, and the gate of the P-MOSFET 50 receives a signal supplied from the other node 4 of the flip-flop circuit 1.

The circuit operation of the arrangement shown in FIG. 13 will be described below. When both the J and K signals are at low logic level (to be referred to as "L" hereinafter), even when the clock CL1 is at high logic level (to be referred to as "H" hereinafter), the nodes 3 (output BP) and 4 (output P) of the flip-flop circuit 1 do not change (the output BP is the inverted signal of the output P). Therefore, even when the next clock CL2 is at "L", the nodes 6 and 5 of the flip-flop circuit 2, i.e., the circuit outputs Q and BQ (the output BQ is the inverted signal of the output Q) do not change, and the previous state is held.

A case will be described below wherein the J signal is at "H" and the K signal is at "L". While the node 5 (BQ) of the flip-flop circuit 2 is at "H", when the clock CL1 goes to "H", the series-connected N-MOSFETs 21, 22, and 23 are turned on, and the node 3 (BP) goes to "L". Therefore, the P-MOSFET 13 is turned on, and the node 4 (P) goes to "H". When the next clock CL2 goes to "L", since the series-connected P-MOSFETs 47 and 48 are turned on, the node 6, i.e., the output Q goes to "H". Therefore, the N-MOSFET 16 is turned on, and the node 5 of the flip-flop circuit 2, i.e., the output BQ goes to "L". When the output Q is at "H", neither the node 3 nor the node 4 changes even when the clock CL1 is at "H", and the outputs Q and BQ do not change even when the next clock CL2 is at "L". Thus, the output Q remains at "H", and the output BQ remains at "L".

A case will be described below wherein the J signal is at "L" and the K signal is at "H". While the node 6 (Q) of the flip-flop circuit 2 is at "H", when the clock CL1 goes to "H", the series-connected N-MOSFETs 24, 25, and 26 are turned on, the node 4 (P) goes to "L", and the P-MOSFET 11 is turned on. As a result, the node 3 (BP) goes to "H". When the next clock CL2 goes to "L", since the series-connected P-MOSFETs 49 and 50 are turned on, the node 5 goes to H. Therefore, the P-MOSFET 18 is turned on, and the node 6 of the flip-flop circuit 2, i.e., the output Q goes to "L". When the output BQ is at "H", the nodes 3 and 4 do not change even when the clock CL1 goes to "H", and the outputs Q and BQ do not change even when the next clock CL2 is at "L".

Thus, the output Q remains at "L", and the output BQ remains at "H".

A case will be described below wherein both the J and K signals are at "H". While the node 6 (Q) of the flip-flop circuit 2 is at "H", when the clock CL1 goes to "H", the series-connected N-MOSFETs 24, 25, and 26 are turned on, the node 4 (P) goes to "L", and the P-MOSFET 11 is turned on. As a result, the node 3 (BP) goes to "H". When the next clock CL2 goes to "L", since the series-connected P-MOSFETs 49 and 50 are turned on, the node 5 goes to "H". As a result, the N-MOSFET 18 is turned on, and the node 6 goes to "L". Therefore, the output Q goes to "L", and the output BQ goes to "H". While both the J and K signals are at "H", and while the node 5 (BQ) is at "H" (Q is at "L"), when the clock CL1 goes to "H", the N-MOSFETs 21, 22, and 23 are turned on, and the node 3 (BP) goes to "L". Then, since the P-MOSFET 13 is turned on, the node 4 (P) goes to "H". When the next clock CL2 goes to "L", since the P-MOSFETs 47 and 48 are turned on, the node 6 goes to "H". As a result, the N-MOSFET 16 is turned on, and the node 5 goes to "L". Therefore, the output Q goes to "H", and the output BQ goes to "L".

As described above, according to the circuit of the embodiment shown in FIG. 13, "L"-level J and K inputs hold the previous state. On the other hand, complementary J and K inputs are read by the flip-flop circuit 1 (master) in response to the clock CL1, are shifted to the flip-flop circuit 2 (slave) in response to the clock CL2, and appear as the outputs Q and BQ. "H"-level J and K inputs invert and output held data. As a result, the circuit of this embodiment serves as a J-K flip-flop. In this embodiment, the clocks CL1 and CL2 may be the same signals.

Figure 14A:
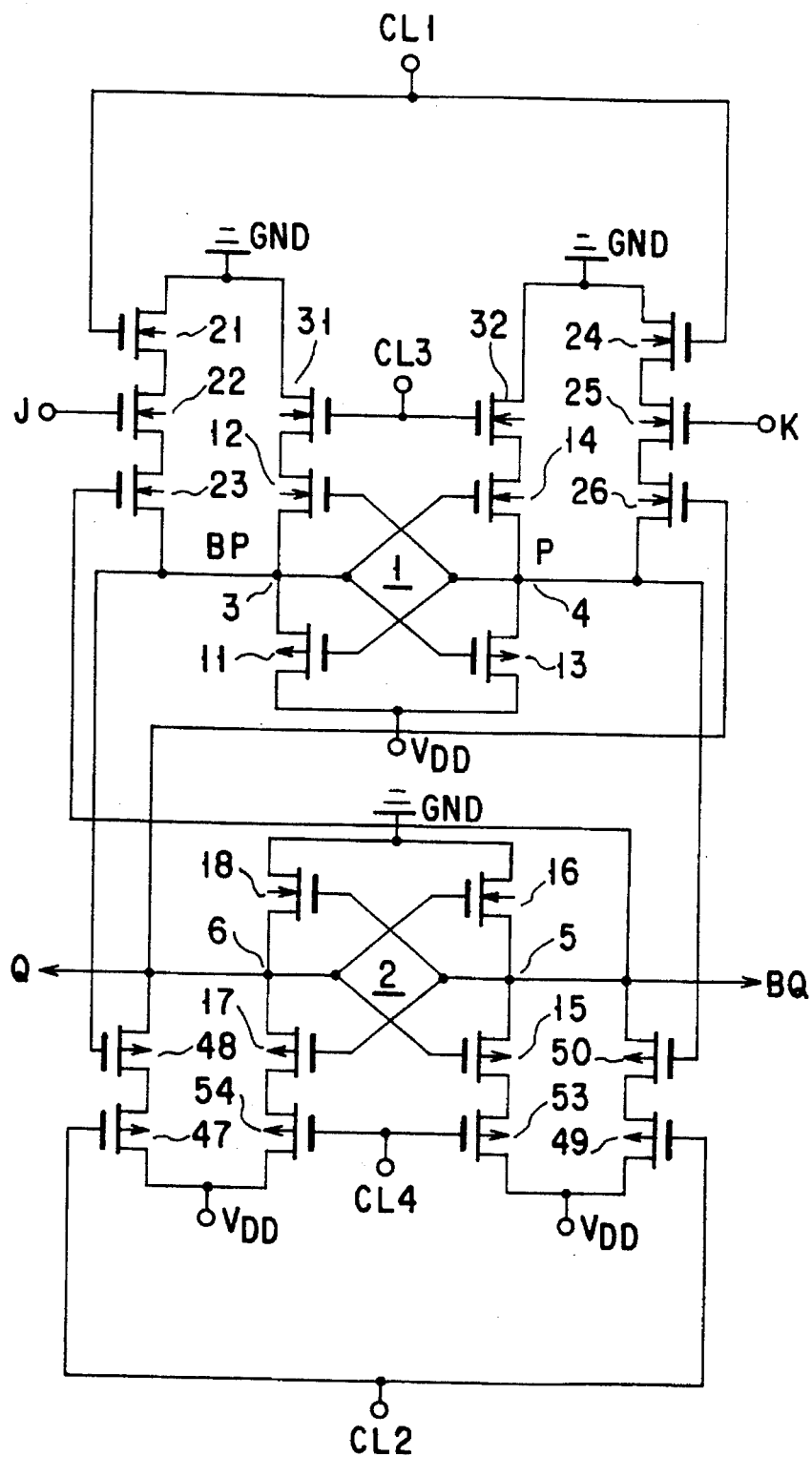
FIGS. 14A and 14B are circuit diagrams showing the arrangements according to the 12th embodiment of the present invention.

FIG. 14A is a circuit diagram showing the arrangement of a J-K flip-flop circuit according to the 12th embodiment of the present invention. In this embodiment, MOSFETs which serve to prevent a short-circuit current from the power supply voltage VDD to the ground voltage GND during an operation are added to the flip-flop circuits 1 and 2, as in FIG. 4A. More specifically, the following arrangements are added to the arrangement shown in FIG. 13. The drain-source path of the N-MOSFET 31 is connected between the N-MOSFET 12 and the ground voltage GND, and the drain-source path of the N-MOSFET 32 is connected between the N-MOSFET 14 and the ground voltage GND. The gates of these N-MOSFETs 31 and 32 are commonly connected to each other, and are ON/OFF controlled by a clock CL3. The source-drain path of a P-MOSFET 53 is connected between the P-MOSFET 15 and the power supply voltage VDD, and the source-drain path of a P-MOSFET 54 is connected between the P-MOSFET 17 and the power supply voltage VDD. The gates of the P-MOSFETs 53 and 54 are commonly connected, and are ON/OFF controlled by a clock CL4. The clock signal CL3 is a signal which goes to "L" when the above-mentioned clock signal CL1 changes from "L" to "H". The clock signal CL4 is a signal which goes to "L" when the above-mentioned clock signal CL2 changes from "H" to "L".

Figure 14B:
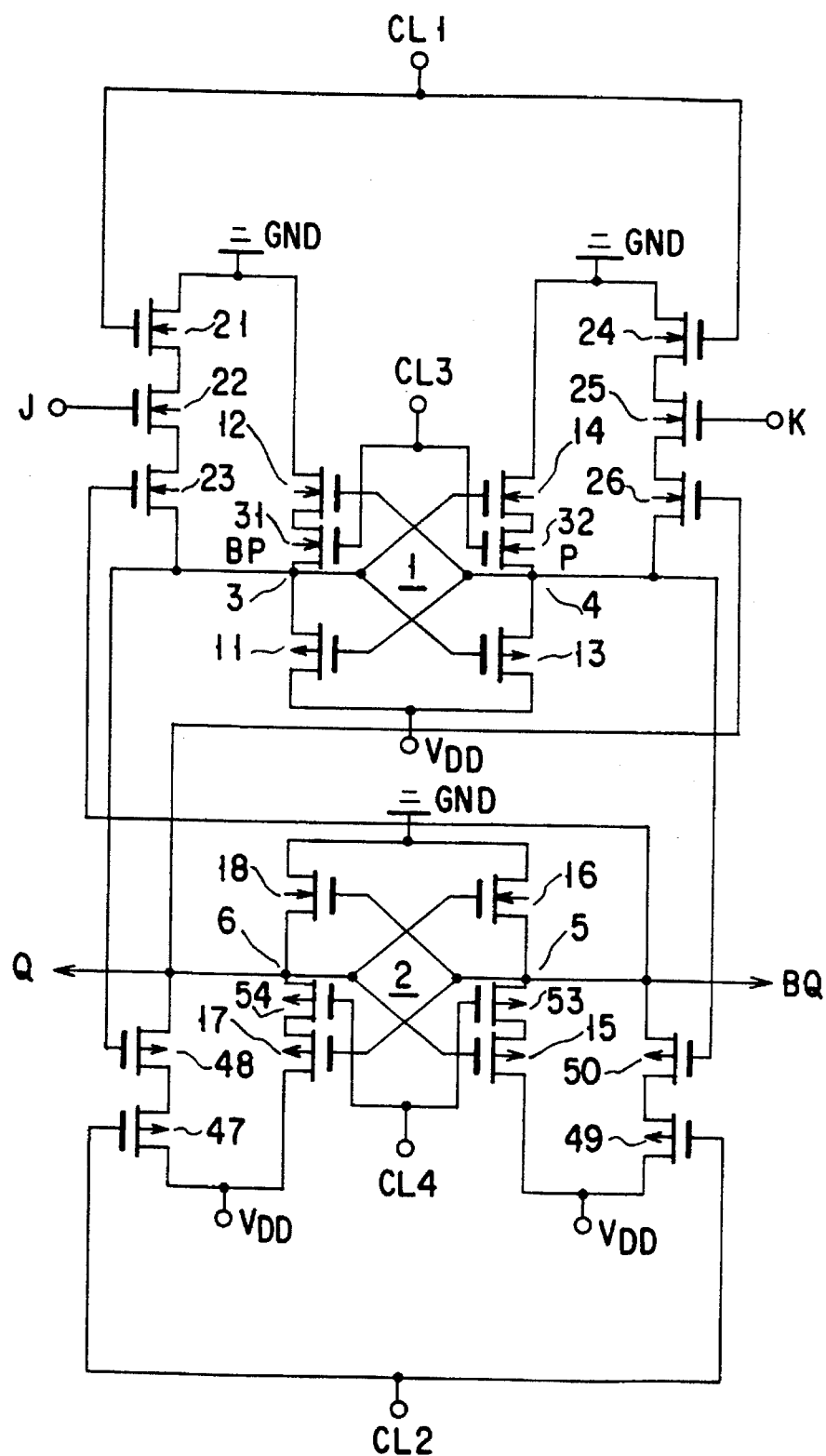

According to the arrangement shown in FIG. 14A, a short-circuit current flowing between VDD and GND can be prevented by transfer control of the N-MOSFETs 31 and 32 and the P-MOSFETs 53 and 54, as shown in FIG. 4A. The connected positions of the N-MOSFETs 31 and 32 and the P-MOSFETs 53 and 54 in the arrangement shown in FIG. 14A may be respectively changed to a position between the node 3 and the N-MOSFET 12, a position between the node 4 and the N-MOSFET 14, a position between the node 5 and the P-MOSFET 15, and a position between the node 6 and the P-MOSFET 17, thus obtaining the same effect as described above (see FIG. 14B). In the embodiment shown in FIG. 13, the short-circuit current can be eliminated by setting sufficiently large ON resistances of the N-MOSFETs 12 and 14 and the P-MOSFETs 15 and 17.

FIG. 15 is a circuit diagram showing the arrangement of a J-K flip-flop circuit according to the 13th embodiment of the present invention. In this embodiment, in order to provide a set input function to the flip-flop circuits 1 and 2, the N-MOSFETs 35 and 37 and P-MOSFETs 56 and 58 are added to the arrangement shown in FIG. 13. More specifically, the drain-source path of the N-MOSFET 35 is connected between the node 3 of the flip-flop circuit 1 and the ground voltage GND, and the drain-source path of the P-MOSFET 58 is connected between the sources of the P-MOSFETs 15 and 49, and the power supply voltage VDD. The gates of the N-MOSFET 35 and the P-MOSFET 58 are applied with a set signal S. The drain-source path of the N-MOSFET 37 is connected between the sources of the N-MOSFETs 14 and 24, and the ground voltage GND, and the drain-source path of the P-MOSFET 56 is connected between the node 6 of the flip-flop circuit 2 and the power supply voltage VDD. The gates of the N-MOSFET 37 and the P-MOSFET 56 are applied with an inverted signal BS of the set signal S via the inverter 40.

According to the arrangement shown in FIG. 15, when the set signal S goes to "H", the N-MOSFET 35 and the P-MOSFET 56 are turned on, and the N-MOSFET 37 and the P-MOSFET 58 are turned off. Therefore, since the node 3 goes to "L", the P-MOSFET 13 is turned on, and the node 4 goes to "H". In addition, since the node 6 (Q) goes to "H", the N-MOSFET 16 is turned on, and the node 5 (BQ) goes to "L". In this manner, a set state is established.

FIG. 16 is a circuit diagram showing the arrangement of a J-K flip-flop circuit according to the 14th embodiment of the present invention. In this embodiment, in order to provide a reset input function to the flip-flop circuits 1 and 2, the N-MOSFETs 41 and 43 and P-MOSFETs 62 and 64 are added to the arrangement shown in FIG. 13. More specifically, the drain-source path of the N-MOSFET 41 is connected between the node 4 of the flip-flop circuit 1 and the ground voltage GND, and the drain-source path of the P-MOSFET 64 is connected between the sources of the P-MOSFETs 17 and 47, and the power supply voltage VDD. The gates of the N-MOSFET 41 and the P-MOSFET 64 are applied with a reset signal R. The drain-source path of the N-MOSFET 43 is connected between the sources of the N-MOSFETs 12 and 21, and the ground voltage GND, and the drain-source path of the P-MOSFET 62 is connected between the node 5 of the flip-flop circuit 2 and the power supply voltage VDD. The gates of the N-MOSFET 43 and the P-MOSFET 62 are applied with an inverted signal BR of the reset signal R via the inverter 45.

According to the arrangement shown in FIG. 16, when the reset signal R goes to "H", the N-MOSFET 41 and the P-MOSFET 62 are turned on, and the N-MOSFET 43 and the P-MOSFET 64 are turned off. Therefore, since the node 4 goes to "L", the P-MOSFET 11 is turned on, and the node 3 goes to "H". In addition, since the node 5 (BQ) goes to "H", the N-MOSFET 18 is turned on, and the node 6 (Q) goes to "L". In this manner, a reset state is established.

Figure 17:
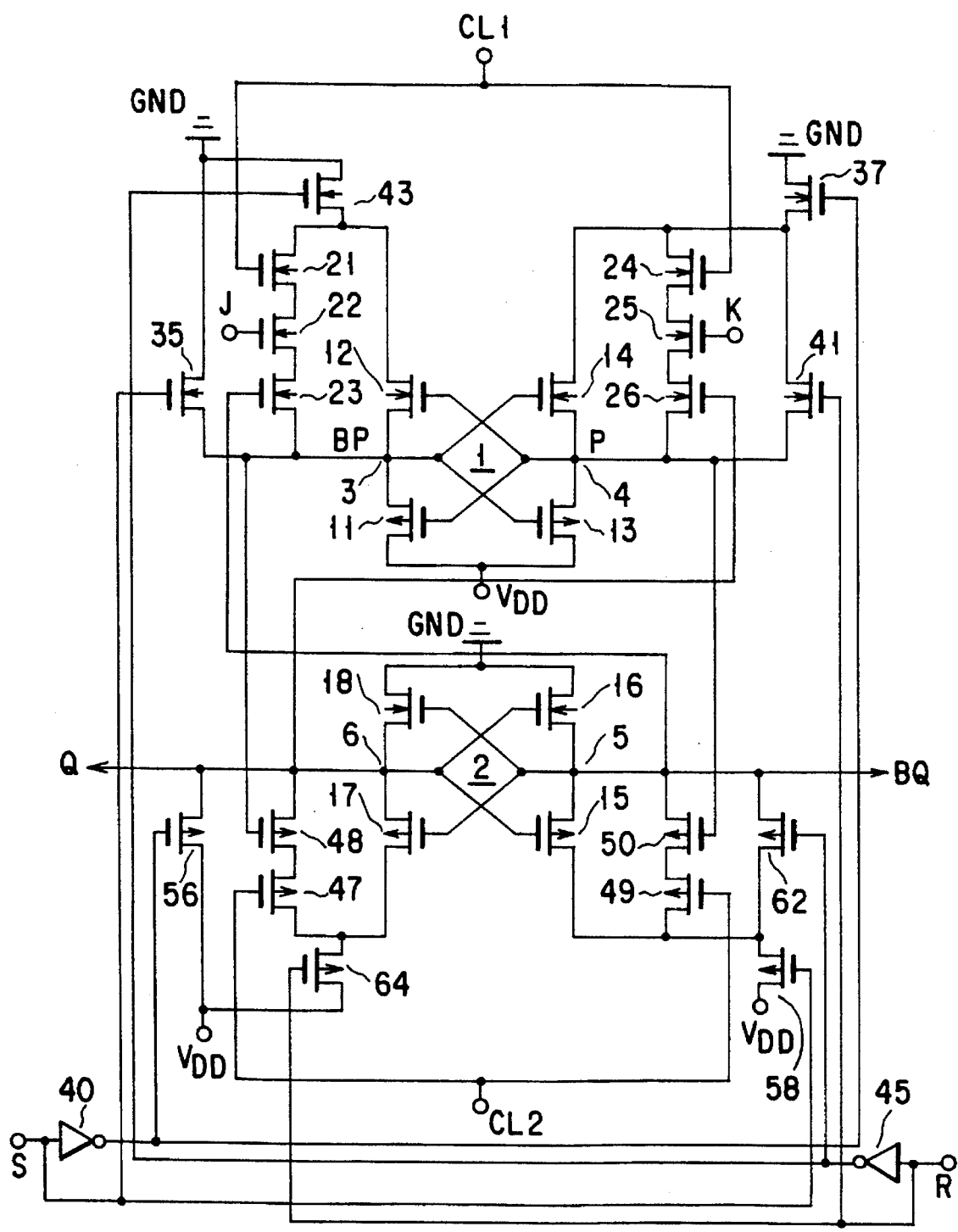
FIG. 17 is a circuit diagram showing the arrangement according to the 15th embodiment of the present invention.

FIG. 17 is a circuit diagram showing the arrangement of a J-K flip-flop circuit according to the 15th embodiment of the present invention. In this embodiment, the set input function shown in FIG. 15 is provided to the arrangement shown in FIG. 16. As compared to the arrangement shown in FIG. 16, the drain-source path of the N-MOSFET 35 is connected between the node 3 and the ground voltage GND, and the drain-source path of the P-MOSFET 58 is connected between the sources of the P-MOSFETs 15, 49, and 62, and the power supply voltage VDD. The gates of the N-MOSFET 35 and the P-MOSFET 58 are applied with a set signal S. The drain-source path of the N-MOSFET 37 is connected between the sources of the N-MOSFETs 14, 24, and 41, and the ground voltage GND, and the drain-source path of the P-MOSFET 56 is connected between the node 6 and the power supply voltage VDD. The gates of the N-MOSFET 37 and the P-MOSFET 56 are applied with an inverted signal BS of the set signal S via the inverter 40. According to the above-mentioned arrangement, when the set and reset signals S and R simultaneously go to "H", the set signal S has priority over the reset signal R.

FIG. 18 is a circuit diagram showing the arrangement of a J-K flip-flop circuit according to the 16th embodiment of the present invention. In this embodiment, the reset input function shown in FIG. 16 is provided to the arrangement shown in FIG. 15. More specifically, in addition to the arrangement shown in FIG. 15, the drain-source path of the N-MOSFET 41 is connected between the node 4 and the ground voltage GND, and the drain-source path of the P-MOSFET 64 is connected between the sources of the P-MOSFETs 17, 47, and 56, and the power supply voltage VDD. The gates of the N-MOSFET 41 and the P-MOSFET 64 are applied with a reset signal R. The drain-source path of the N-MOSFET 43 is connected between the sources of the N-MOSFETs 12, 21, and 35, and the ground voltage GND, and the drain-source path of the P-MOSFET 62 is connected between the node 5 and the power supply voltage VDD. The gates of the N-MOSFET 43 and the P-MOSFET 62 are applied with an inverted signal BR of the reset signal R via the inverter 45. According to the above-mentioned arrangement, when the set and reset signals S and R simultaneously go to "H", the reset signal R has priority over the set signal S.

Figure 19:
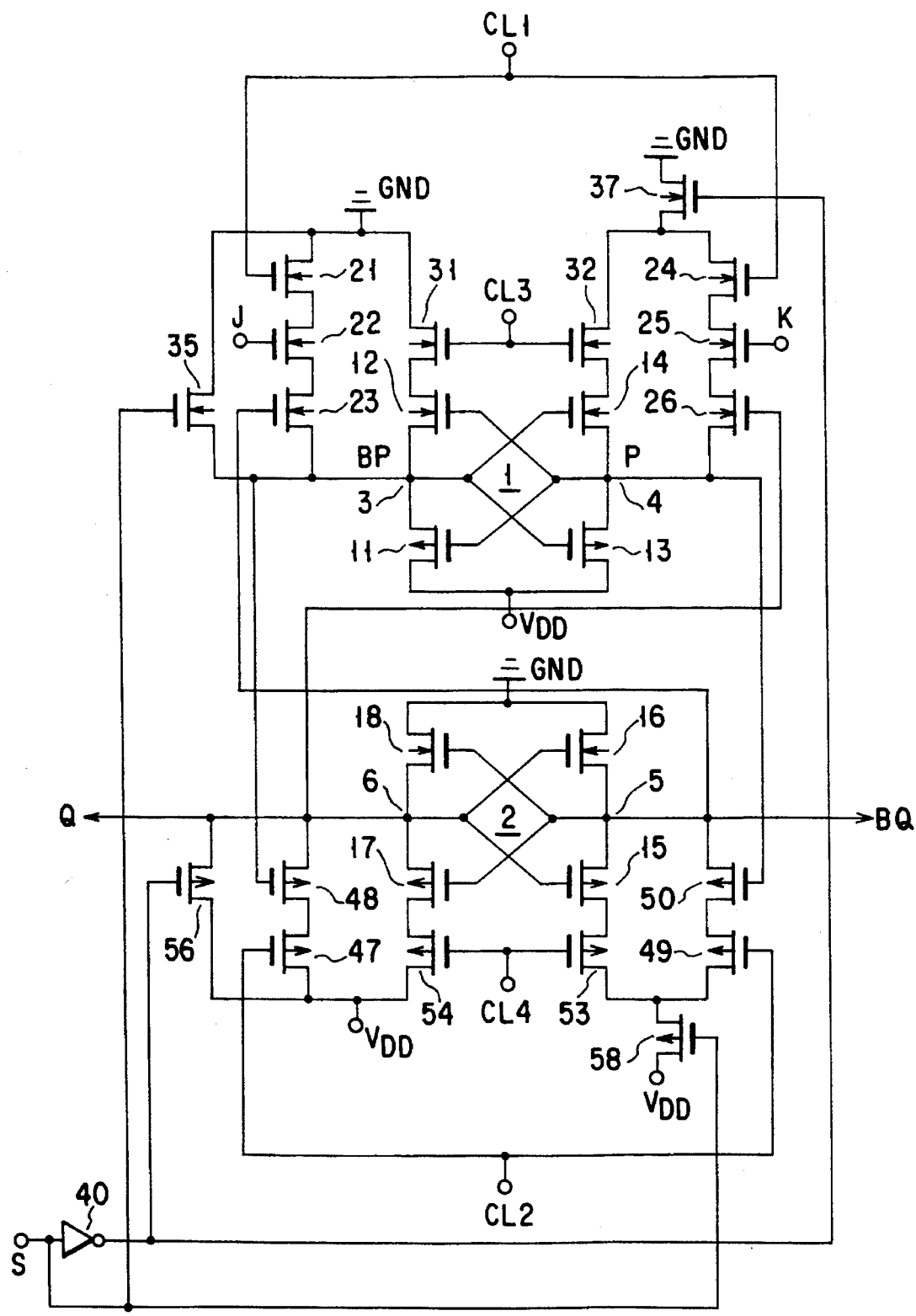
FIG. 19 is a circuit diagram showing the arrangement according to the 17th embodiment of the present invention.

FIG. 19 is a circuit diagram showing the arrangement of a J-K flip-flop circuit according to the 17th embodiment of the present invention. In this embodiment, the arrangement for preventing a short-circuit current shown in FIG. 14A is combined with the arrangement shown in FIG. 15.

FIG. 20 is a circuit diagram showing the arrangement of a J-K flip-flop circuit according to the 18th embodiment of the present invention. In this embodiment, the arrangement for preventing a short-circuit current shown in FIG. 14A is combined with the arrangement shown in FIG. 16.

FIG. 21 is a circuit diagram showing the arrangement of a J-K flip-flop circuit according to the 19th embodiment of the present invention. In this embodiment, the arrangement for preventing a short-circuit current shown in FIG. 14A is combined with the arrangement shown in FIG. 17.

FIG. 22 is a circuit diagram showing the arrangement of a J-K flip-flop circuit according to the 20th embodiment of the present invention. In this embodiment, the arrangement for preventing a short-circuit current shown in FIG. 14A is combined with the arrangement shown in FIG. 18.

In each of the embodiments shown in FIGS. 19 to 22, the arrangement for preventing a short-circuit current shown in FIG. 14A is combined. In place of the arrangement shown in FIG. 14A, the arrangement for preventing a short-circuit current shown in FIG. 14B may be combined with each of the arrangements shown in FIGS. 19 to 22 (the combined arrangements are not shown).

According to each of the embodiments shown in FIGS. 13 to 22, the number of P-channel MOS transistors is larger than that in each of the embodiments shown in FIGS. 3 to 12, but the same clock signal can be advantageously used as the clock signals CL1 and CL2. With this advantage, integration in terms of wiring can be facilitated as compared to the circuits shown in FIGS. 3 to 12, and the circuits shown in FIGS. 13 to 22 can be effectively built in LSIs.

In each of the embodiments shown in FIGS. 3 to 22, the J-K flip-flop circuit may be constituted by replacing the P-MOSFETs and N-MOSFETs with each other, and at the same time, replacing the power supply voltage VDD and the ground voltage GND with each other.

Figure 23:
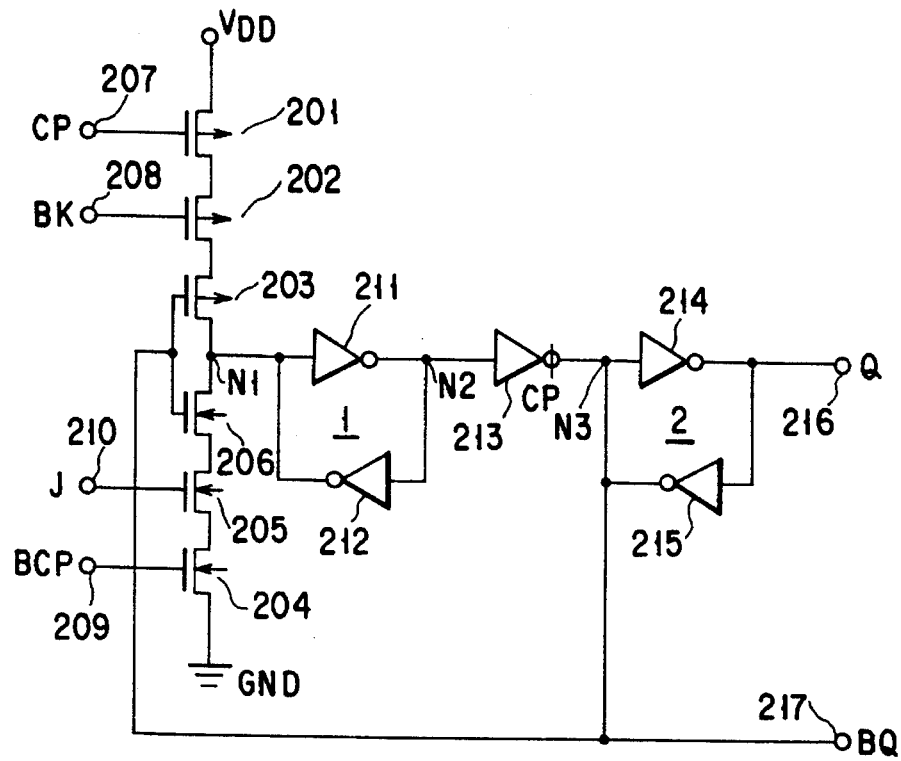
FIG. 23 is a circuit diagram showing the arrangement according to the 21st embodiment of the present invention.

FIG. 23 is a circuit diagram showing the arrangement of a J-K flip-flop circuit according to the 21st embodiment of the present invention. A series circuit of P-MOSFETs 201, 202, and 203 is connected between a power supply voltage VDD and a node N1. Furthermore, a series circuit of N-MOSFETs 204, 205, and 206 is connected between a ground voltage GND and the node N1. Input terminals 207 and 208 are respectively connected to the gates of the P-MOSFETs 201 and 202. The input terminal 207 receives a clock signal CP, and the input terminal 208 receives an inverted signal BK of a K signal. Input terminals 209 and 210 are respectively connected to the gates of the N-MOSFETs 204 and 205. The input terminal 209 receives an inverted signal BCP of the clock signal CP, and the input terminal 210 receives a J signal. Inverters 211 and 212 (flip-flop circuit 1), which are connected in antiparallel to each other, are connected between the node N1 and a node N2. The node N2 is connected to the input terminal of a clocked inverter 213. The clocked inverter 213 is activated and outputs an inverted input when the clock signal CP is at "H". A node N3 at the output side of the clocked inverter 213 is connected to the gates of the P-MOSFET 203 and the N-MOSFET 206. Inverters 214 and 215 (flip-flop circuit 2), which are connected in antiparallel to each other, are connected between the node N3 and an output terminal 216. The node N3 is connected to an output terminal 217. An output Q is obtained from the output terminal 216, and an output BQ as an inverted signal of the output Q is obtained from the output terminal 217.

The circuit operation of FIG. 23 will be explained below with reference to the following cases (A) to (D).
(A) When J signal is at "H" and K signal is at "L":
The N-MOSFET 205 is turned on, and the P-MOSFET 202 is turned off. When the node N1 is at "H", since the node N3 is also at "H", the N-MOSFET 206 is set in an ON state. At this time, when the clock signal BCP goes to "H", the N-MOSFET 204 is turned on, and the node N1 changes from "H" to "L". When the next clock signal CP goes to "H", the node N3, i.e., the output terminal 217 goes to "L", and the output terminal 216 goes to "H". In other words, the output Q goes to "H", and the output BQ goes to "L". When the node N1 is at "L", since the node N2 is held at "H" by the flip-flop circuit 1, the node N3 is at "L", and the flip-flop circuit 2 holds the output terminal 216 at "H". At this time, since the node N3 is at "L", the P-MOSFET 203 is turned on, and the N-MOSFET 206 is turned off. However, since P-MOSFET 202 is kept off, even when the clock signal CP goes to "L" and the P-MOSFET 201 is turned on, the potential level of the node N1 does not change. Therefore, even when the next clock signal CP goes to "H" and the clocked inverter 213 is activated, the output Q is maintained at "H".

(B) When J signal is at "L" and K signal is at "H":
The N-MOSFET 205 is turned off, and the P-MOSFET 202 is turned on. When the node N1 is at "L", since the flip-flop circuit 1 holds the node N2 at "H", the node N3 is at "L", and hence, the P-MOSFET 203 is turned on. At this time, when the clock signal CP goes to "L", the P-MOSFET 201 is turned on, and the node N1 changes from "L" to "H". When the next clock signal CP goes to "H", the node N3, i.e., the output terminal 217 goes to "H", and the output terminal 216 goes to "L". In other words, the output Q goes to "L", the output BQ goes to "H", and this circuit is set in a reset state. On the other hand, when the node N1 is at "H", since the flip-flop circuit 1 holds the node N2 at "L", the node N3 is at "H", and the flip-flop circuit 2 holds the output terminal 216 at "L". At this time, since the node N3 is at "H", the P-MOSFET 203 is turned off, and the N-MOSFET 206 is turned on. However, since the N-MOSFET 205 is kept off, even when the clock signal BCP goes to "H" and the N-MOSFET 204 is turned on, the potential level of the node N1 does not change. Therefore, even when the next clock signal CP goes to "H" and the clocked inverter 213 is activated, the output Q is maintained at "L".

(C) When both J and K signals are at "L":
Both the N-MOSFET 205 and the P-MOSFET 202 are turned off. Even when the clock signal CP goes to "L" or the signal BCK goes to "H", the potential level of the node N1 does not change. Therefore, the node N2 and the output terminal 216 are held in the previous state by the flip-flop circuits 1 and 2, respectively. For this reason, even when the next clock signal CP goes to "H" and the clocked inverter 213 is activated, the output Q maintains the previous state.

(D) When both J and K signals are at "H":
Both the N-MOSFET 205 and the P-MOSFET 202 are turned on. At this time, the entire circuit serves as a toggle type flip-flop circuit (toggle mode), and the output Q is inverted each time the clock signal CP changes from "L" to "H".

As can be understood from the above description, the circuit shown in FIG. 23 operates as a J-K flip-flop circuit. The number of elements required for constituting the circuit shown in FIG. 23 is a total of 18 elements, i.e., six elements (the P-MOSFETs 201, 202, and 203, and the N-MOSFETs 204, 205, and 206)+eight elements (the inverters 211, 212, 214, and 215×2)+four elements constituting the clocked inverter 213. In this manner, a high-integration, low-cost arrangement of the J-K flip-flop circuit is attained.

Figure 24:
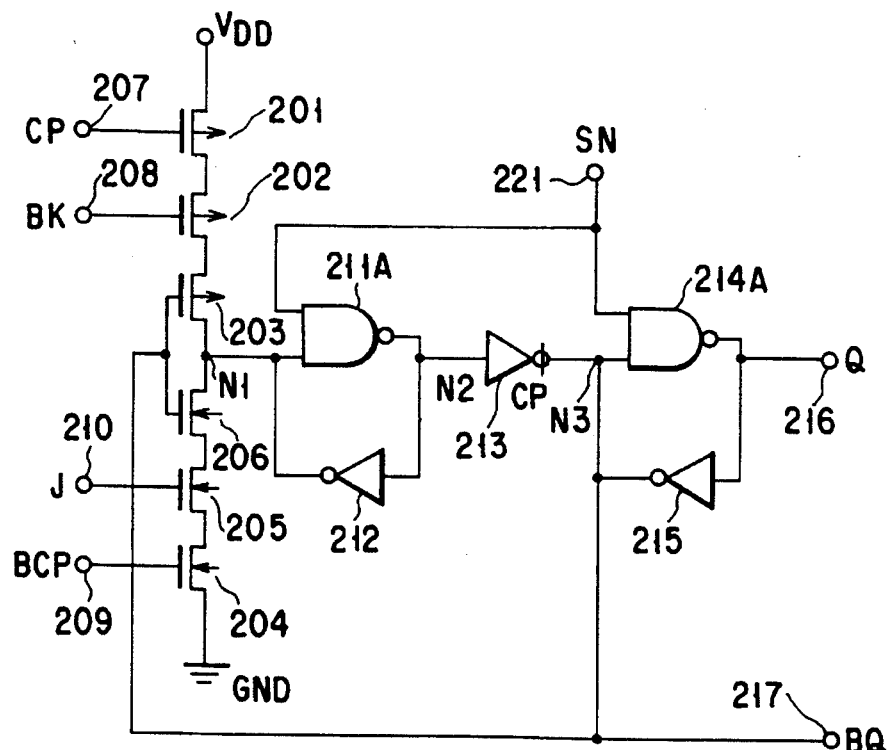
FIG. 24 is a circuit diagram showing the arrangement according to the 22nd embodiment of the present invention.

FIG. 24 is a circuit diagram showing the arrangement of a J-K flip-flop circuit according to the 22nd embodiment of the present invention. The difference from FIG. 23 is that 2-input NAND gates 211A and 214A are arranged in place of the inverters 211 and 214 in FIG. 23, and one input of each of these NAND gates 211A and 214A is commonly connected to a terminal 221 for receiving an SN signal. With this arrangement, when an SN signal is at "L", the output Q is at "H", and the output BQ is at "L", thus establishing a set state.

FIG. 25 is a circuit diagram showing the arrangement of a J-K flip-flop circuit according to the 23rd embodiment of the present invention. The difference from FIG. 23 is that 2-input NOR gates 211B and 214B are arranged in place of the inverters 211 and 214 in FIG. 23, and one input of each of these NOR gates 211B and 214B is commonly connected to a terminal 222 for receiving an R signal. With this arrangement, when an R signal is at "H", the output Q is at "L", and the output BQ is at "H", thus establishing a reset state.

FIG. 26 is a circuit diagram showing the arrangement of a J-K flip-flop circuit according to the 24th embodiment of the present invention. The difference from FIG. 23 is that a BJ signal obtained by inverting the J signal is input to the terminal 208 in place of the BK signal in FIG. 23, and a K signal is input to the terminal 210 in place of the J signal, thus obtaining a signal BQ from the terminal 216 and a signal Q from the terminal 217. With this arrangement, the output Q obtained from the node N3 is supplied to the gates of the P-MOSFET 203 and the N-MOSFET 206.

The circuit operation of FIG. 26 will be explained below with reference to the following cases (A) to (D).

(A) When J signal is at "H" and K signal is at "L":

The N-MOSFET 205 is turned off, and the P-MOSFET 202 is turned on. When the node N1 is at "L", since the node N3 is also at "L", the P-MOSFET 203 is set in an ON state. At this time, when the clock signal BCP goes to "L", the P-MOSFET 201 is turned on, and the node N1 changes from "L" to "H". When the next clock signal CP goes to "H", the node N3, i.e., the output terminal 217 goes to "H", and the circuit is set in a set state. On the other hand, when the node N1 is at "H", the node N3 is at "H", the P-MOSFET 203 is turned off, and the N-MOSFET 206 is turned on. In this state, since the N-MOSFET 205 is kept off, even when the clock signal BCP goes to "H" and the N-MOSFET 204 is turned on, the potential level of the node N1 does not change. Therefore, when the next clock signal CP goes to "H" and the clocked inverter 213 is activated, the output Q maintains "H", and the circuit is set in a set state.

(B) When J signal is at "L" and K signal is at "H":

The N-MOSFET 205 is turned on, and the P-MOSFET 202 is turned off. When the node N1 is at "H", the node N3 is also at "H", and hence, the N-MOSFET 206 is turned on. At this time, when the clock signal BCP goes to "H", the N-MOSFET 204 is turned on, and the node N1 changes from "H" to "L". When the next clock signal CP goes to "H", the node N3, i.e., the output terminal 217 goes to "L", and the output terminal 216 goes to "H". In other words, the output Q goes to "L", the output BQ goes to "H", and this circuit is set in a reset state. When the node N1 is at "L", the node N3 is at "L", the P-MOSFET 203 is turned on, and the N-MOSFET 206 is turned off. However, since the P-MOSFET 202 is kept off, even when the clock signal CP goes to "L" and the P-MOSFET 201 is turned on, the potential level of the node N1 does not change. Therefore, even when the next clock CP goes to "H" and the clocked inverter 213 is activated, the output Q maintains "L", and the circuit is set in a reset state.

(C) when both J and K signals are at "L":

Both the N-MOSFET 205 and the P-MOSFET 202 are turned off. Even when the clock signal CP goes to "L" or the signal BCP goes to "H", the potential level of the node N1 does not change. Therefore, even when the next clock signal CP goes to "H", the output Q maintains the previous state.

(D) When both J and K signals are at "H":

Both the N-MOSFET 205 and the P-MOSFET 202 are turned on. At this time, the entire circuit serves as a toggle type flip-flop circuit (toggle mode) as in FIG. 23, and the output Q is inverted each time the clock signal CP changes from "L" to "H".

As can be understood from the above description, the circuit shown in FIG. 26 can also serve as a J-K flip-flop circuit. The number of elements required for constituting FIG. 26 is also 18 as in FIG. 23. In this manner, a high-integration, low-cost arrangement of a J-K flip-flop circuit can be attained.

Figure 27:
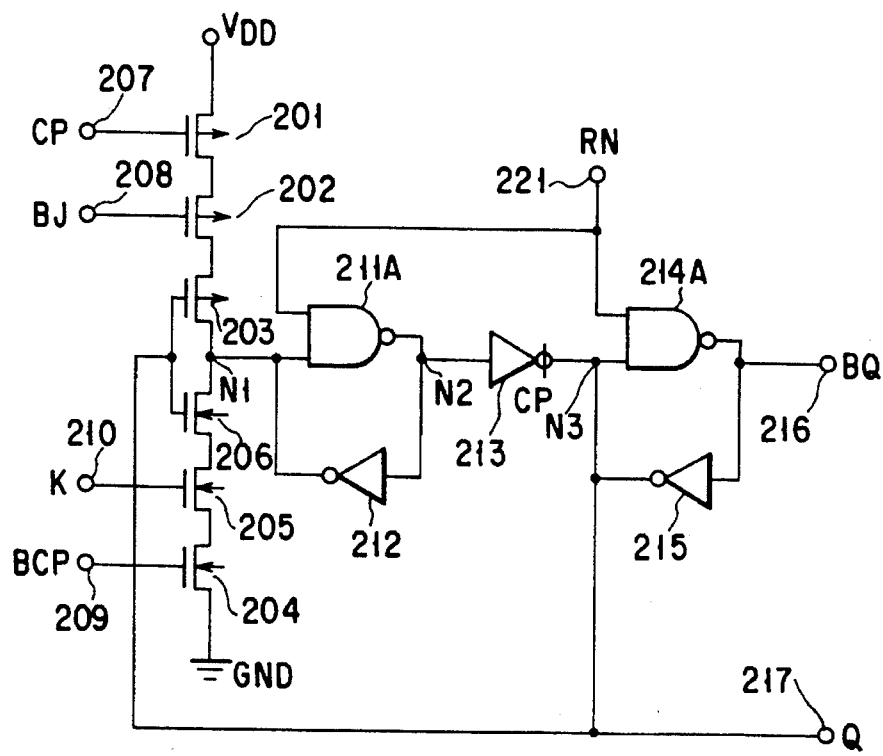
FIG. 27 is a circuit diagram showing the arrangement according to the 25th embodiment of the present invention.

FIG. 27 is a circuit diagram showing the arrangement of a J-K flip-flop circuit according to the 25th embodiment of the present invention. The difference from FIG. 26 is that 2-input NAND gates 211A and 214A are arranged in place of the inverters 211 and 214 in FIG. 26, and one input of each of these NAND gates 211A and 214A is commonly connected to a terminal 221 for receiving an RN signal. With this arrangement, when an RN signal is at "L", the output Q is at "L", and the output BQ is at "H", thus establishing a reset state.

Figure 28:
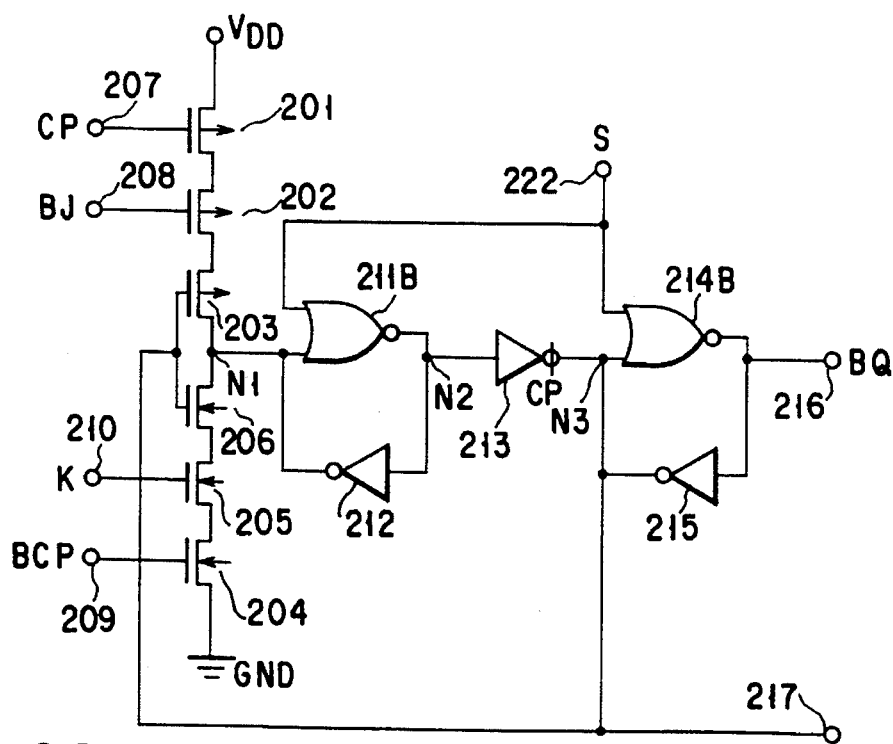
FIG. 28 is a circuit diagram showing the arrangement according to the 26th embodiment of the present invention.

FIG. 28 is a circuit diagram showing the arrangement of a J-K flip-flop circuit according to the 26th embodiment of the present invention. The difference from FIG. 26 is that 2-input NOR gates 211B and 214B are arranged in place of the inverters 211 and 214 in FIG. 26, and one input of each of these NOR gates 211B and 214B is commonly connected to a terminal 222. The terminal 222 receives an S signal. With this arrangement, when an S signal is at "H", the output Q is at "H", and the output BQ is at "L", thus establishing a set state.

FIG. 29 is a circuit diagram showing the arrangement of a J-K flip-flop circuit according to the 27th embodiment of the present invention. The difference from FIG. 23 is that a transfer control & latch circuit of a level signal constituted by the clocked inverter 213 and the inverters 214 and 215 in FIG. 23 is replaced by a transfer gate 313, and inverters 314 and 315. The node N3 is connected to the output terminal 216. The output Q is obtained from the output terminal 216, and the output BQ as the inverted signal of the output Q is obtained from the output terminal 217.

FIG. 30 is a circuit diagram showing the arrangement of a J-K flip-flop circuit according to the 28th embodiment of the present invention. The difference from FIG. 26 is that a transfer control & latch circuit of a level signal constituted by the clocked inverter 213 and the inverters 214 and 215 in FIG. 26 is replaced by a transfer gate 313, and inverters 314 and 315. The node N3 is connected to the output terminal 216. The output Q is obtained from the output terminal 216, and the output BQ as the inverted signal of the output Q is obtained from the output terminal 217.

According to the arrangement shown in FIG. 29 or 30, since the transfer gate 313 can be constituted by two elements, a J-K flip-flop circuit having a smaller number of elements than that in FIG. 23 or 26 can be realized. Of course, the arrangement shown in FIG. 29 can be arranged as in FIG. 24 or 25, and the arrangement shown in FIG. 30 can be arranged as in FIG. 27 or 28.

As described above, according to the present invention, a J-K flip-flop circuit which can greatly reduce the number of elements as compared to a conventional circuit, can achieve a high-speed operation, and requires only a small area on an integrated circuit, can be provided.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A J-K flip-flop circuit comprising:

at least three MOS transistors of a first conductivity type which have current paths connected in series with each other between a first power supply terminal and a signal node, gates of said MOS transistors of the first conductivity type respectively receiving a clock signal, an inverted signal of a K signal, and an inverted signal BQ of an output Q associated with a data output; and at least three MOS transistors of a second conductivity type which have current paths connected in series with each other between a second power supply terminal and the signal node, gates of said MOS transistors of the second conductivity type respectively receiving an inverted signal of the clock signal, a J signal, and the inverted signal BQ.

2. A circuit according to claim 1, further comprising:

first data holding means for holding a voltage level corresponding to the signal node;

gate control means connected to an output node of said first data holding means;

second data holding means for holding a voltage level from said gate control means; and data output means for causing said second data holding means to correspond to the data output.

3. A circuit according to claim 2, wherein said gate control means comprises a clocked inverter.

4. A circuit according to claim 2, wherein said gate control means comprises a transfer gate circuit.

5. A circuit according to claim 2, wherein said gate control means comprises a clocked inverter which is activated by the clock signal, and said data output means causes an inverted/non-inverted output of said second data holding means to correspond to an output B/BQ of the data output.

6. A circuit according to claim 2, wherein said gate control means comprises a transfer gate circuit which is activated by the clock signal, and said data output means causes an inverted/non-inverted output of said second data holding means to correspond to an output BQ/Q of the data output.

7. A circuit according to claim 2, further comprising:

at least one of set signal input means and reset signal input means.

8. A J-K flip-flop circuit comprising:

at least three MOS transistors of a first conductivity type which have current paths connected in series with each other between a first power supply terminal and a signal node, gates of said MOS transistors of the first conductivity type respectively receiving a clock signal, an inverted signal of a J signal, and an output signal Q associated with a data output, and at least three MOS transistors of a second conductivity type which have current paths connected in series with each other between a second power supply terminal and the signal node, gates of said MOS transistors of the second conductivity type respectively receiving an inverted signal of the clock signal, a K signal, and the output signal Q.

9. A circuit according to claim 8, further comprising:

first data holding means for holding a voltage level corresponding to the signal node;

gate control means connected to an output node of said first data holding means;

second data holding means for holding a voltage level from said gate control means; and data output means for causing said second data holding means to correspond to the data output.

10. A circuit according to claim 9, wherein said gate control means comprises a clocked inverter.

11. A circuit according to claim 9, wherein said gate control means comprises a transfer gate circuit.

12. A circuit according to claim 9, wherein said gate control means comprises a clocked inverter which is activated by the clock signal, and said data output means causes an inverted/non-inverted output of said second data holding means to correspond to an output BQ/Q of the data output.

13. A circuit according to claim 9, wherein said gate control means comprises a transfer gate circuit which is activated by the clock signal, and said data output means causes an inverted/non-inverted output of said second data holding means to correspond to an output Q/BQ of the data output.

14. A circuit according to claim 9, further comprising:

at least one of set signal input means and reset signal input means.

* * * * *